(12) United States Patent
Kito

(10) Patent No.: US 6,930,342 B2
(45) Date of Patent: Aug. 16, 2005

(54) SEMICONDUCTOR MEMORY AND METHOD OF MANUFACTURING THE SAME

(75) Inventor: Masaru Kito, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/685,422

(22) Filed: Oct. 16, 2003

(65) Prior Publication Data

US 2004/0126968 A1 Jul. 1, 2004

(30) Foreign Application Priority Data

Oct. 18, 2002 (JP) ........................................ 2002-303859

(51) Int. Cl.[7] ............................................ H01L 27/108
(52) U.S. Cl. ........................ 257/296; 438/241; 438/243
(58) Field of Search ................................ 257/296, 301, 257/241, 243

(56) References Cited

U.S. PATENT DOCUMENTS

| | | | | |
|---|---|---|---|---|
| 5,021,354 A | * | 6/1991 | Pfiester | ........................ 438/230 |
| 6,235,574 B1 | | 5/2001 | Tobben et al. | |
| 6,248,623 B1 | * | 6/2001 | Chien et al. | ................. 438/241 |
| 6,531,350 B2 | * | 3/2003 | Satoh et al. | ................. 438/197 |

FOREIGN PATENT DOCUMENTS

| | | |
|---|---|---|
| JP | 2001-352046 | 12/2001 |
| JP | 2002-43549 | 2/2002 |

* cited by examiner

Primary Examiner—David Nelms
Assistant Examiner—Quoc Hoang
(74) Attorney, Agent, or Firm—Finnegan, Henderson, Farabow, Garrett & Dunner, L.L.P.

(57) ABSTRACT

According to the present invention, there is provided a semiconductor memory having a memory cell array region and peripheral circuit region, comprising, a gate electrode formed on a semiconductor substrate via a first insulating film in each of said memory cell array region and peripheral circuit region, and including a conductive layer which at least partially includes a silicon layer, and a second insulating film, a first oxide film formed on side surfaces of said conductive layer included in said gate electrode and on said semiconductor substrate in said memory cell array region, a second oxide film formed on side surfaces of said conductive layer included in said gate electrode and on said semiconductor substrate in said peripheral circuit region, and having a film thickness smaller than that of said first oxide film, a first nitride film formed on side surfaces of said gate electrode in said memory cell array region, and a second nitride film formed on side surfaces of said gate electrode in said peripheral circuit region, and having a film thickness larger than that of said first nitride film.

7 Claims, 22 Drawing Sheets

⟨MEMORY CELL ARRAY REGION⟩  ⟨PERIPHERAL CIRCUIT REGION⟩

(MEMORY CELL ARRAY REGION) (PERIPHERAL CIRCUIT REGION)

SEMICONDUCTOR MEMORY AND METHOD OF MANUFACTURING THE SAME

CROSS REFERENCE TO RELATED APPLICATION

This application is based upon and claims benefit of priority under 35 USC 119 from the Japanese Patent Application No. 2002-303859, filed on Oct. 18, 2002, the entire contents of which are incorporated herein by reference.

BACKGROUND OF THE INVENTION

The present invention relates to a semiconductor memory and a method of manufacturing the same and, more particularly, to a DRAM (Dynamic Random Access Memory: a random access memory requiring data storage) or a DRAM embedded memory having a DRAM function, and a method of manufacturing the same.

It is increasingly demanded to maintain the cell characteristics (pause/retention) of a DRAM and increase the operating speed of a peripheral circuit at the same time. However, it is very difficult to satisfy both of these two requirements.

To increase the operating speed of a transistor in a peripheral circuit, it is possible to improve the short channel effect by decreasing the depth of source and drain layers, and increase the driving power by reducing the channel resistance. To this end, however, an impurity must be ion-implanted at low acceleration when source and drain diffusion layers are formed, thereby requiring a thin oxide film on the substrate surface.

To decrease the thickness of the oxide film on the substrate surface, the thickness of an oxide film on the side surfaces of a gate electrode must also be decreased. Unfortunately, this intensifies the gate edge electric field. Consequently, in the state in which data is stored by applying a voltage of about 0 or −0.4 [V] to the gate electrode, a GIDL (Gate Induced Drain Leakage) current by which electric charge passes through the substrate increases. This worsens the data holding characteristic.

In the conventional manufacuring method, a gate electrode side wall oxidation process is performed at once after gate electrodes are formed. Therefore, the thickness of the sidewall oxide film, the shape of an end portion of the gate electrode in contact with the substrate surface, and the thickness of the oxide film on the substrate surface in a memory cell array region are the same as those in a peripheral circuit region.

To improve the characteristics, particularly, the data holding time characteristic of a DRAM cell, it is preferable to increase the thickness of the sidewall oxide film of a transistor and increase the oxide film thickness near the end portion of the gate electrode in the memory cell array region. This is so because the GIDL current can be reduced by alleviating field concentration between the gate electrode end portion and the substrate.

In the conventional device, however, the oxide film thickness in the memory cell array region is the same as that in the peripheral circuit region. Therefore, when an impurity is ion-implanted to form source and drain layers, this ion-implantation must be performed at relatively high acceleration so that the impurity is well implanted even if a thick oxide film is present. This makes it difficult to increase the operating speed of a transistor in the peripheral circuit region by decreasing the thickness of diffusion layers of the transistor.

In contrast, if the sidewall oxide film thickness of the gate electrode is reduced to decrease the thickness of the source and drain diffusion layers of the transistor in the peripheral circuit region, the end-portion film thickness of the gate electrode of the transistor in the memory cell array region also decreases. This increases the GIDL current and deteriorates the data holding characteristic.

Examples of references disclosing the conventional semiconductor memories are as follows.
[Patent Reference 1]
    Japanese Patent Laid-Open No. 2002-43549
[Patent Reference 2]
    U.S. Pat. No. 6,235,574B1

In the conventional semiconductor memory as described above, the optimum conditions of the sidewall oxide film thickness of the gate electrode in the memory cell array region have a tradeoff relationship with those in the peripheral circuit region. Accordingly, it is necessary to sacrifice one of these gate electrodes or to form them under intermediate conditions. This makes it impossible to improve the holding characteristic of the memory cell and increase the operating speed of the peripheral circuit at the same time.

SUMMARY OF THE INVENTION

According to an aspect of the present invention, there is provided a semiconductor memory device having a memory cell array region and peripheral circuit region, comprising:

a gate electrode formed on a semiconductor substrate via an insulating film in each of said memory cell array region and peripheral circuit region, and including a conductive layer;

a first oxide film formed on side surfaces of said conductive layer of said gate electrode and on said semiconductor substrate in said memory cell array region;

a second oxide film formed on side surfaces of said conductive layer of said gate electrode and on said semiconductor substrate in said peripheral circuit region, and having a film thickness smaller than that of said first oxide film;

a first nitride film formed on side surfaces of said gate electrode in said memory cell array region; and a second nitride film formed on side surfaces of said gate electrode in said peripheral circuit region, and having a film thickness larger than that of said first nitride film.

According to an aspect of the present invention, there is provided a semiconductor memory device having a memory cell array region and peripheral circuit region, comprising:

a gate electrode formed on a semiconductor substrate via an insulating film in each of said memory cell array region and peripheral circuit region, a first oxide film formed on side surfaces of said gate electrode in said memory cell array region;

a second oxide film formed on side surfaces of said gate electrode in said peripheral circuit region, and having a film thickness smaller than that of said first oxide film;

a first nitride film formed on said first oxide film on the side surfaces of said gate electrode in said memory cell array region; and a second nitride film formed on said second oxide film on the side surfaces of said gate electrode in said peripheral circuit region, and having a film thickness larger than that of said first nitride film.

According to an aspect of the present invention, there is provided a method for manufacturing semiconductor memory device having a memory cell array region and peripheral circuit region, comprising:

forming a first insulating film on a semiconductor substrate in the memory cell array region and peripheral circuit region;

forming, on the first insulating film, a conductive layer which at least partially includes a silicon layer, and a second insulating film;

forming a gate electrode by patterning the conductive layer and second insulating film into a gate electrode shape;

forming a first oxide film by annealing side surfaces of the conductive layer included in the gate electrode and a surface of the semiconductor substrate in an oxidizing ambient;

forming a first nitride film on an entire surface;

patterning the first nitride film such that the first nitride film is removed from the memory cell array region and left behind in the peripheral circuit region;

forming a second oxide film by annealing side surfaces of the conductive layer included in the gate electrode and a surface of the semiconductor substrate in the memory cell array region in an oxidizing ambient, while the peripheral circuit region is covered with the first nitride film;

etching the first nitride film remaining in the peripheral circuit region to leave the first nitride film behind on side surfaces of the gate electrode in the peripheral circuit region;

forming a second nitride film on an entire surface; and etching the second nitride film to leave the second nitride film behind on the side surfaces of the gate electrodes in the memory cell array region and peripheral circuit region.

According to an aspect of the present invention, there is provided a method for manufacturing semiconductor memory device having a memory cell array region and peripheral circuit region, comprising:

forming a first insulating film on a semiconductor substrate in the memory cell array region and peripheral circuit region;

forming a conductive layer which at least partially includes a silicon layer on the first insulating film;

forming a gate electrode by patterning the conductive layer into a gate electrode shape;

forming a first oxide film by annealing side surfaces of the gate electrode and a surface of the semiconductor substrate in an oxidizing ambient;

forming a first nitride film on an entire surface;

patterning the first nitride film such that the first nitride film is removed from the memory cell array region and left behind in the peripheral circuit region;

forming a second oxide film by annealing the side surfaces of the gate electrode and the surface of the semiconductor substrate in the memory cell array region in an oxidizing ambient, while the peripheral circuit region is covered with the first nitride film;

etching the first nitride film remaining in the peripheral circuit region to leave the first nitride film behind on the side surfaces of the gate electrode in the peripheral circuit region;

forming a second nitride film on an entire surface; and etching the second nitride film to leave the second nitride film behind on the side surfaces of the gate electrodes in the memory cell array region and peripheral circuit region.

DESCRIPTION OF THE PREFERRED EMBODIMENTS

Embodiments of the present invention will be described below with reference to the accompanying drawings. The first to third embodiments are trench capacitor type DRAMs, and the fourth to sixth embodiments are stacked capacitor type DRAMs.

(1) First Embodiment

Figure 1:
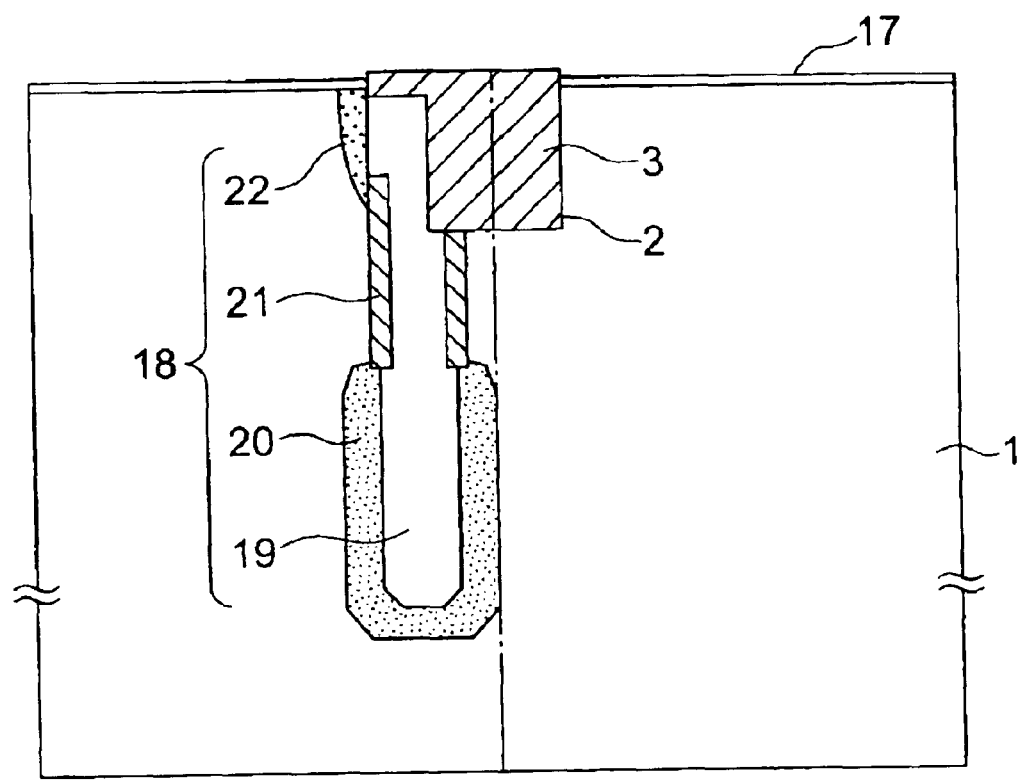
FIGS. 1–12 are the longitudinal sectional views showing the sections of a semiconductor memory in the respective manufacturing steps according to the first embodiment of the present invention.

As shown in FIG. 1, in a surface portion of a semiconductor substrate 1, an element isolation groove 2 about 3,000 Å deep is formed by photolithography and RIE. After a thermal oxide film is formed by thermally oxidizing silicon side surfaces in the element isolation groove 2, a silicon oxide film such as TEOS is buried as an element isolation buried oxide film 3. An element region and element isolation region are formed through a planarizing process such as chemical mechanical polishing (to be referred to as CMP hereinafter).

This embodiment is a trench capacitor type DRAM. In a memory cell array region, therefore, a trench 19 is formed in the surface portion of the semiconductor substrate 1, and a buried plate electrode 20, insulating oxide film 21, and storage node contact 22 are formed to obtain a trench capacitor 18.

On the surface of the semiconductor substrate 1, a sacrificial oxide film 17 (about 70 Å thick) is formed by thermal oxidation. After that, a well/channel impurity is implanted in the memory cell array region and in a peripheral circuit region by photolithography and ion implantation. Finally, activation annealing is performed.

Figure 2:
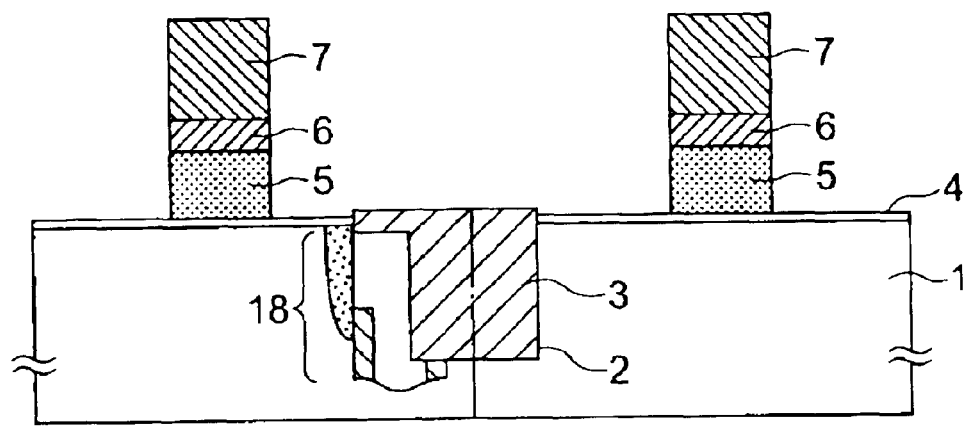

After the sacrificial oxide film 17 on the semiconductor substrate 1 is peeled, as shown in FIG. 2, a gate oxide film 4 (about 70 Å thick) is formed by thermal oxidation. A phosphorus-doped, n-type amorphous silicon film 5 (about 1,000 Å thick) and tungsten silicon (WSi) film 6 (about 550 Å thick), for example, as gate electrode materials, and a cap silicon nitride film 7 (about 2,000 Å thick) are sequentially deposited by low-pressure chemical vapor deposition (to be referred to as LP-CVD), sputtering, or the like. The amorphous silicon film 5 can also be a p-type film.

A photoresist film (not shown) having a gate electrode pattern is formed by photolithography. Reactive ion etching (to be referred to as RIE hereinafter) is then performed to etch the cap silicon nitride film 7, and the amorphous silicon film 5 and tungsten silicon film 6 as the gate electrode materials, thereby forming the gate electrode pattern.

Figure 3:
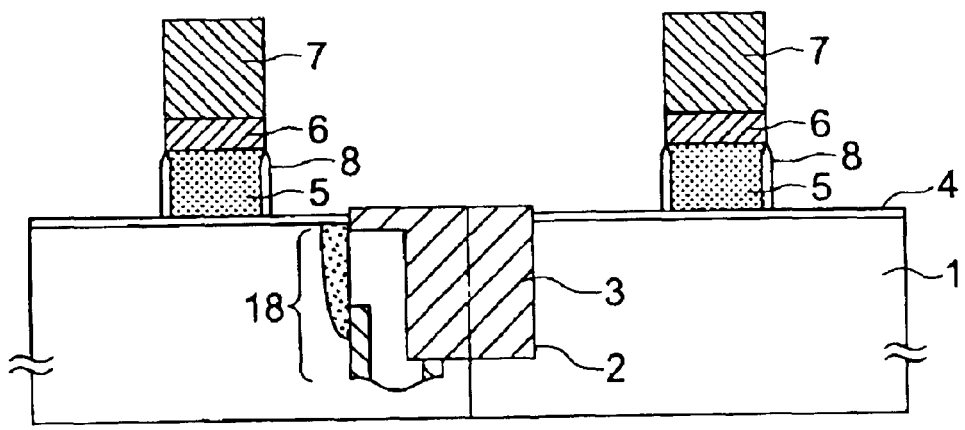

To suppress abnormal oxidation of tungsten, an annealing step is performed by RTA (Rapid Thermal Anneal). After that, as shown in FIG. 3, RTO (Rapid Thermal Oxidation) is performed to form an oxide film 8 on the gate electrode side surfaces.

Since the surface portion of the semiconductor substrate 1 also oxidizes, a silicon oxide film forms. The film thickness of the gate sidewall oxide film 8 is about 50 Å or less, preferably, about 20 Å, so as not to increase the oxide film thickness on the surface of the semiconductor substrate 1 such that low acceleration conditions are applicable when a source/drain impurity for a transistor in the peripheral circuit region is ion-implanted.

Note that annealing for the gate sidewall oxide film 8 is sometimes unnecessary, depending on the conditions such as the gate electrode materials.

Figure 4:
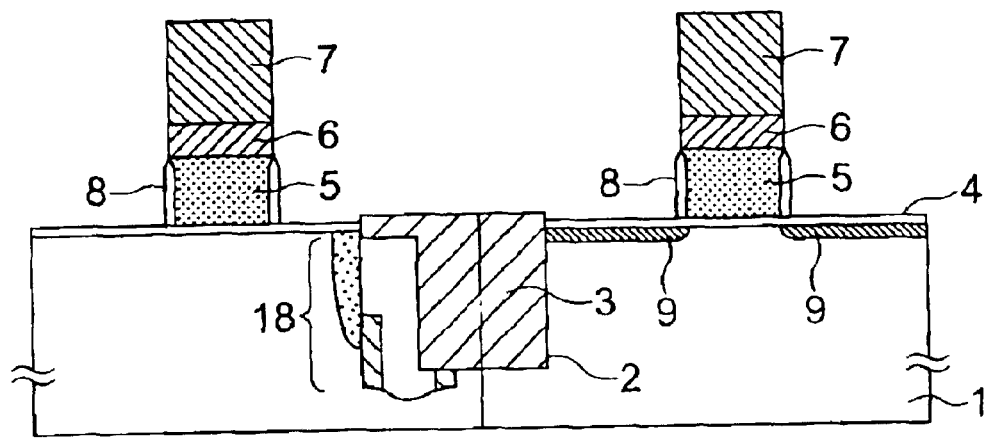

As shown in FIG. 4, in the peripheral circuit region, a photoresist film (not shown) is formed and an impurity is ion-implanted in order to form an extended portion in an LDD structure of the source/drain diffusion layers of the transistor. After that, the resist film is peeled.

After the impurity is ion-implanted, activation annealing for activating the implanted impurity is performed in, e.g., a nitrogen ambient at about 950° C. for about 10 sec. Note that this annealing step need not always be performed.

Figure 5:
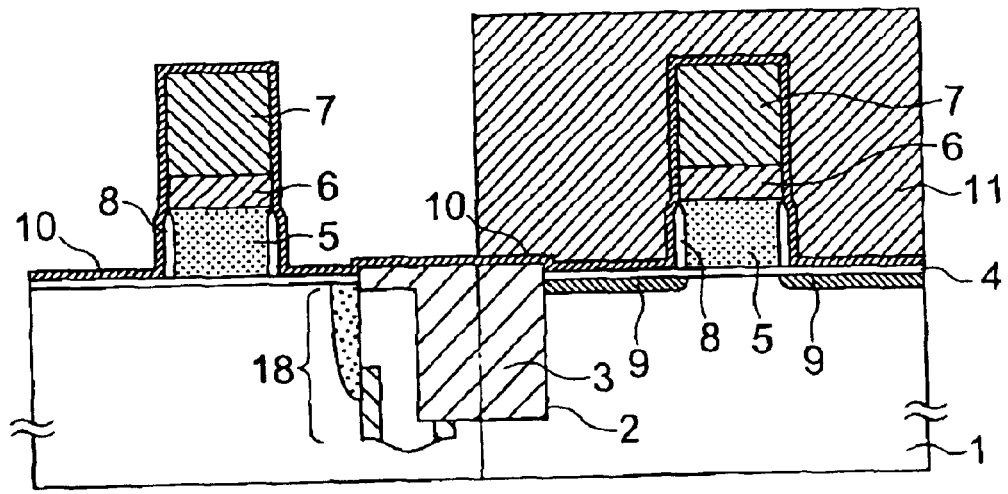
Figure 6:
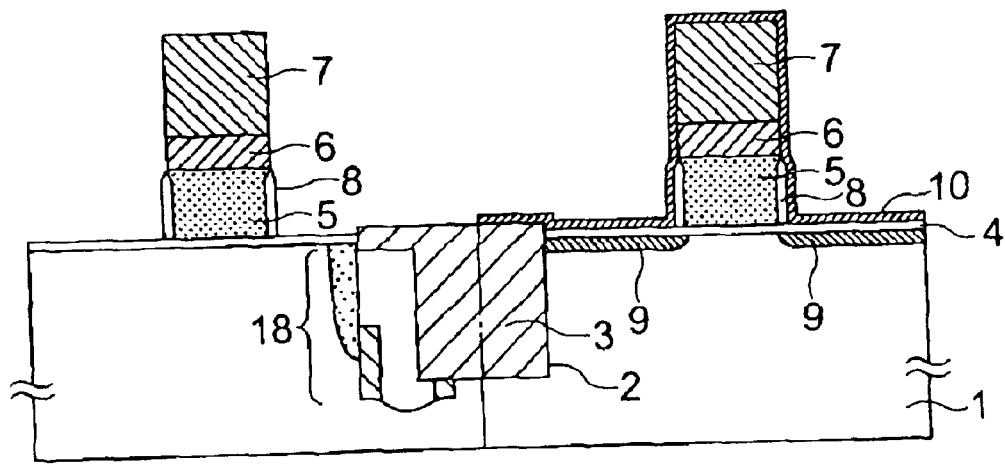

As shown in FIG. 5, a silicon nitride film 10 for protecting the peripheral circuit region is deposited to have a thickness of, e.g., 100 Å by LP-CVD. The film formation temperature can be, e.g., about 750° C. However, if film formation at a lower temperature is possible, the film formation temperature is not limited to the above value. Then, a photoresist film 11 for protecting the peripheral circuit region is formed. As shown in FIG. 6, the silicon nitride film 10 deposited in the memory cell array region is peeled by isotropic etching (e.g., wet etching or CDE), and the photoresist film 11 is peeled after that.

Figure 7:
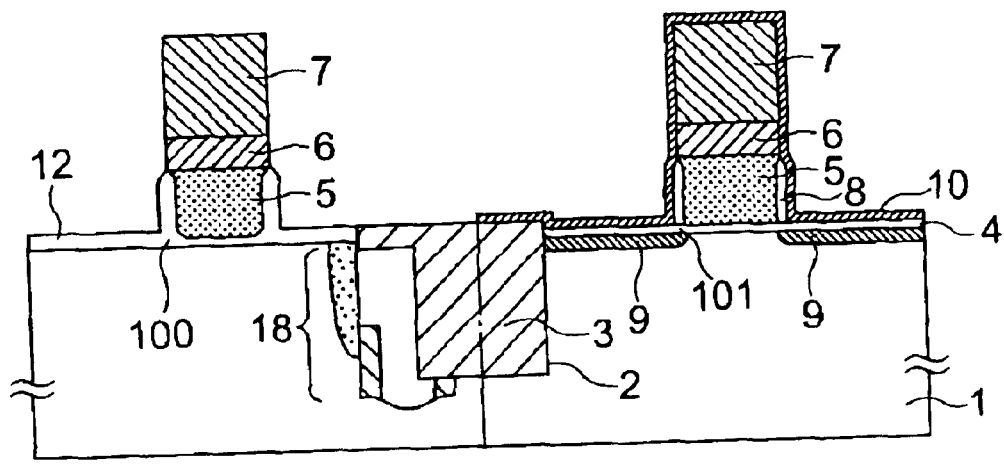

As shown in FIG. 7, while the silicon nitride film 10 is left behind only in the peripheral circuit region, a thermal oxide film 12 is formed on the side surfaces of a gate electrode 5 and on the surface of the semiconductor substrate 1 in the memory cell array region by thermal oxidation. The final thickness of the thermal oxide film 12 must be controlled to, e.g., about 100 to 120 Å. Note that this film thickness can be freely changed by combining the device characteristics and is not limited to the range of 100 to 120 Å. Since the peripheral circuit region is covered with the silicon nitride film 10, the surface of the semiconductor substrate 1 and the side walls of the gate electrode 5 do not oxidize in the peripheral circuit region.

Consequently, as shown in FIG. 7, bird's beaks 100 formed by the thermal oxide film 12 below the side surfaces of the gate electrode 5 in the memory cell array region are larger than bird's beaks 101 formed by the oxide film 8 below the side surfaces of the gate electrode 5 in the peripheral circuit region.

In addition, the thickness of the oxide film formed on the side surfaces of the gate electrode 5 in the memory cell array region is larger than that in the peripheral circuit region. This brings about the same effect for the oxide film thickness on the surface of the semiconductor substrate 1; the oxide film on the substrate in the memory cell array region is thicker than that in the peripheral circuit region. This contributes to the formation of a shallow source/drain junction by ion implantation at low acceleration in the peripheral circuit region.

After that, the silicon nitride film 10 is etched back by RIE under the conditions by which the selectivity is high for the thermal oxide film 12. Consequently, as shown in FIG. 8, the silicon nitride film on the silicon substrate surface and on the element isolation buried oxide film in the peripheral circuit region are etched away, and the silicon nitride film side walls remain on the side surfaces of the transistor gate in the peripheral circuit region.

Figure 9:
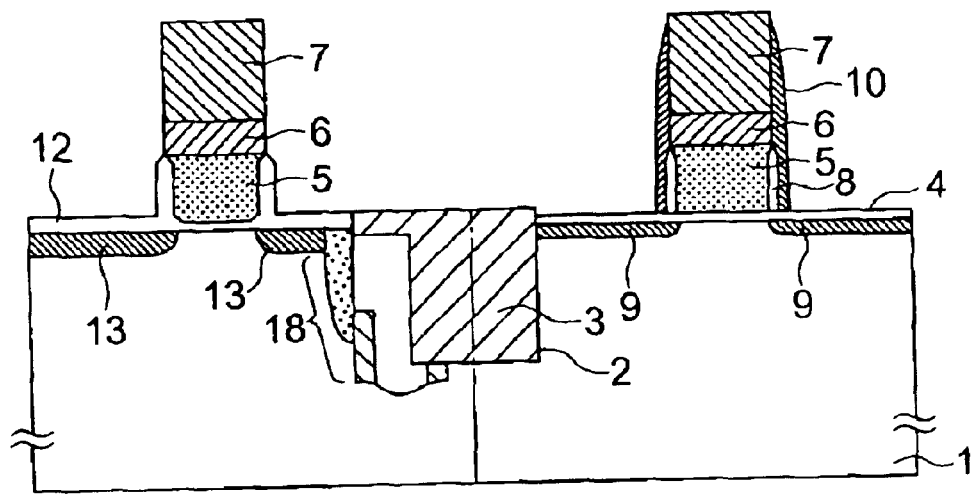

In this state, a photoresist film (not shown) is formed by photolithography. As shown in FIG. 9, a source/drain impurity is ion-implanted only in the memory cell array region, thereby forming source/drain diffusion layers 13. After that, annealing for activating the impurity is performed in, e.g., a nitrogen ambient at about 950° C. for about 10 sec.

Figure 10:
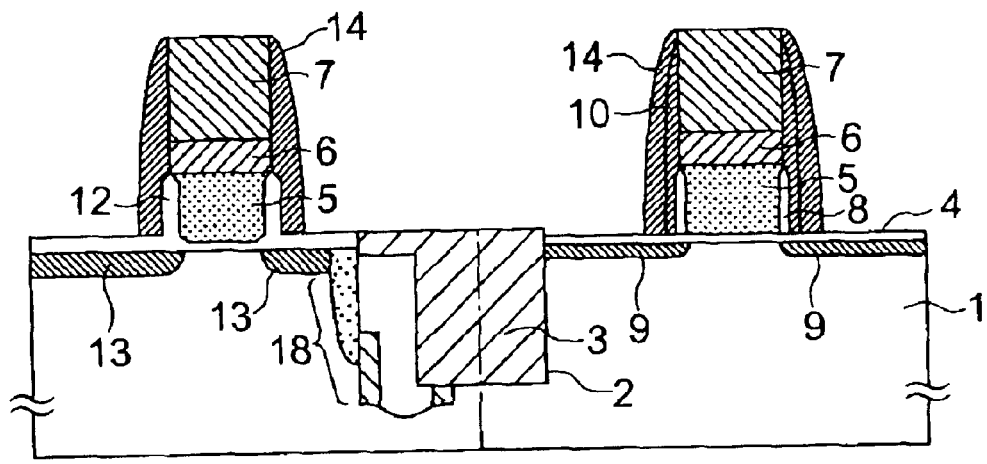

A silicon nitride film about 200 Å thick is then deposited by LP-CVD, and the entire surface is etched back by RIE. Consequently, as shown in FIG. 10, a spacer silicon nitride film 14 is formed on the side surfaces of the gate electrodes 5 of the transistors in both the memory cell array region and peripheral circuit region.

Figure 8:
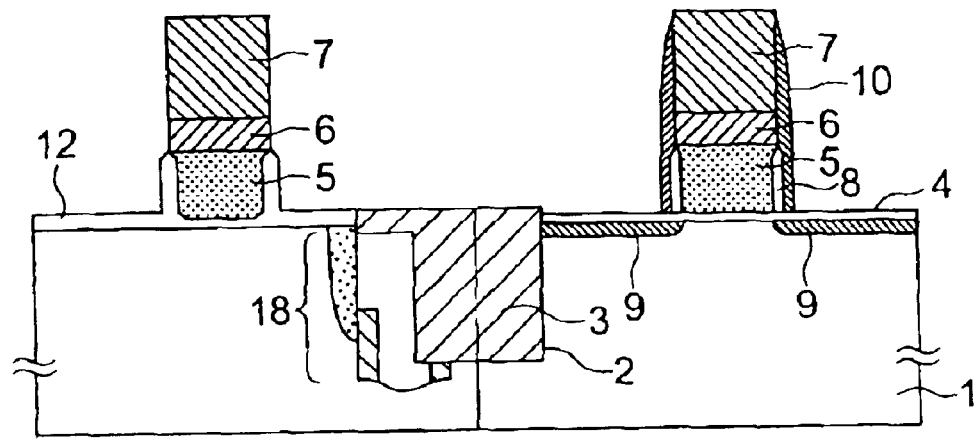

The thickness of the spacer silicon nitride film of the transistor in the peripheral circuit region is about 300 Å, i.e., larger than that (about 200 Å) in the memory cell region, since this spacer silicon nitride film includes both the silicon nitride film 14 and the silicon nitride film 10 formed in the step shown in FIG. 8.

As described above, the film thickness of the gate electrode side walls in the peripheral circuit region is large, so the source/drain diffusion layers can be formed away from the conductive layer 5 of the gate electrode. Accordingly, it is possible to suppress the short channel effect and increase the driving power of this transistor in the peripheral circuit region.

Figure 11:
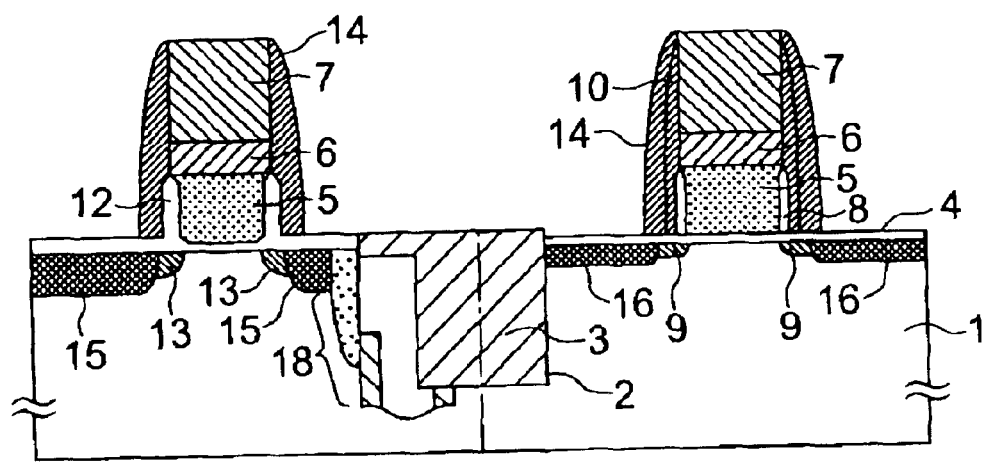
Figure 12:
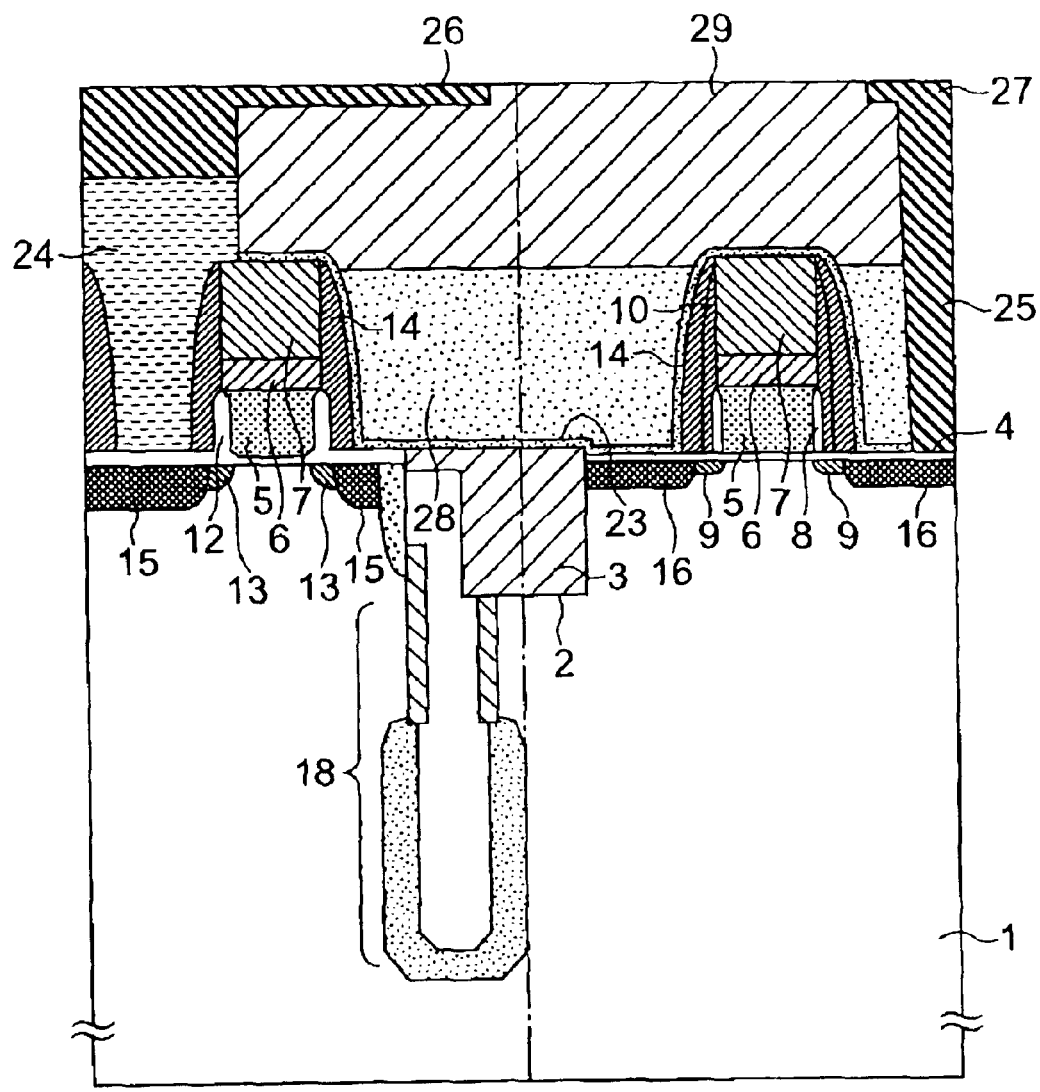

In both the peripheral circuit region and memory cell array region, a photoresist film (not shown) is formed by photolithography, an impurity for forming a source/drain is ion-implanted, and activation annealing for activating the impurity is performed in, e.g., a nitrogen ambient at about 950° C. for about 10 sec. Consequently, as shown in FIG. 11, it is possible to form source/drain diffusion layers 15 in the transistor of the memory cell array region, and source/drain diffusion layers 16 in the transistor of the peripheral circuit region.

After that, a barrier silicon nitride film 23 which functions as a stopper when contact hole etching is performed is deposited on the entire surface to have a film thickness of, e.g., about 80 Å by LP-CVD. In addition, a dielectric interlayer 28 made of BPSG is deposited and planarized by CMP. Contact holes are then formed by photolithography and RIE. In the peripheral circuit region, a contact 25 is formed by burying a metal material such as titanium/titanium nitride-tungsten. In the memory cell array region, a memory cell bit line contact 24 is formed.

After that, aluminum or the like is deposited on the entire surface, and photolithography and RIE are used to form a wiring layer 26 such as a bit line in the memory cell array region, and a peripheral circuit wiring layer 27 in the peripheral circuit region, thereby finally completing a DRAM.

In this embodiment, the gate electrode sidewall film thickness can be increased in the memory cell array region and decreased in the peripheral circuit region. In particular, the bird's beaks formed below the side walls of the gate electrode in the memory cell array region are larger than those in the peripheral circuit region. Since this alleviates field concentration in this vicinity, the GIDL current reduces, so the data holding characteristic improves. Furthermore, in the peripheral circuit region, the source/drain structure is formed as a shallow junction, and this realizes a high operating speed.

In this embodiment, when the gate electrodes are formed, patterning is performed while the conductive layer made up of the polysilicon film 5 and tungsten film 6 and the cap silicon nitride film 7 are stacked. This makes the application of a self-alignment contact formation process feasible, and thereby improves the applicability to a device having a high integration degree, such as a general-purpose DRAM memory cell.

(2) Second Embodiment

This embodiment differs from the above first embodiment in the formation of source/drain diffusion layers of a transistor in a peripheral circuit region.

Figure 13:
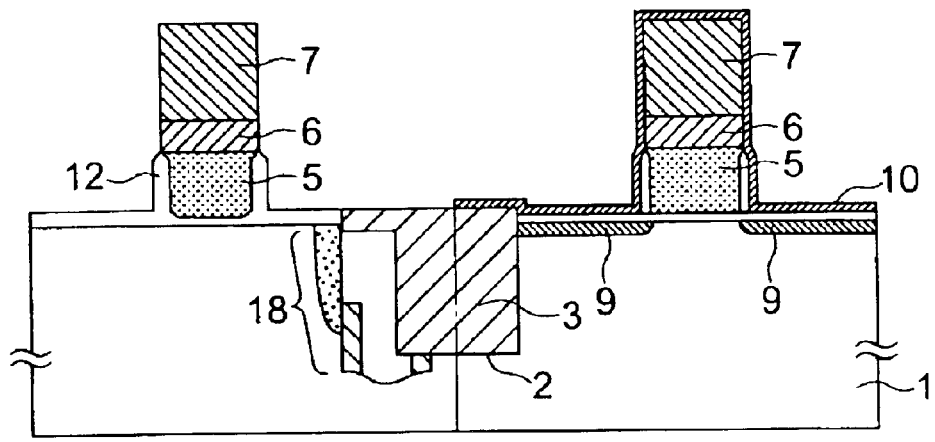
FIGS. 13–17 are the longitudinal sectional views showing the sections of a semiconductor memory in the respective manufacturing steps according to the second embodiment of the present invention.

The manufacturing process is similar to that of the first embodiment up to the step shown in FIG. 7 (i.e., a trench capacitor 18 is formed, a gate electrode sidewall oxide film 8 is formed through the element isolation step and gate electrode formation step, transistor source/drain diffusion layers 9 are formed in the peripheral circuit region, a silicon nitride film 10 is formed only in the peripheral circuit region, and a thermal oxide film 12 is formed on the side surfaces of a gate electrode 5 in a memory cell array region by thermal oxidation). FIG. 13 shows the section of the device in this stage.

After that, the silicon nitride film 10 is etched back by RIE under the conditions by which the selectivity is high for the thermal oxide film 12. Consequently, the silicon nitride film 10 on the surface of a semiconductor substrate 1 and on an element isolation buried oxide film 3 in the peripheral circuit region are etched away, and the silicon nitride film 10 remains on the side surfaces of a transistor gate electrode 5 in the peripheral circuit region.

Figure 14:
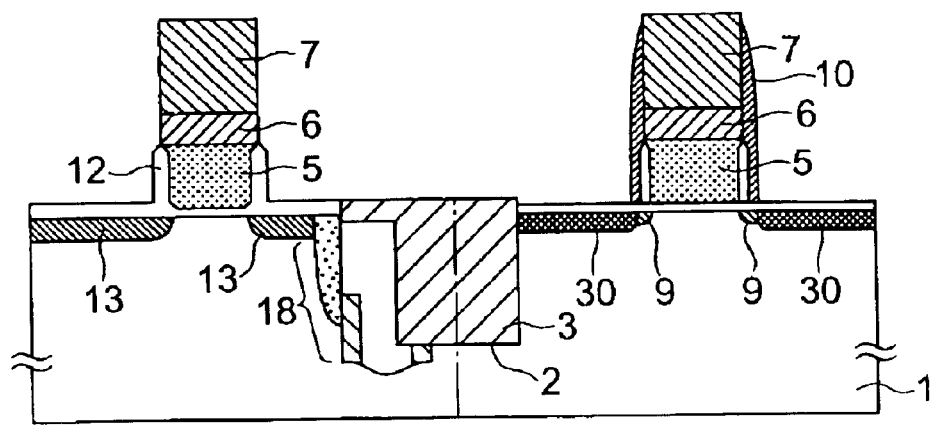

In this state, a photoresist film (not shown) is formed by photolithography, and a source/drain impurity is ion-implanted only in the memory cell array region, thereby forming source/drain diffusion layers 13 as shown in FIG. 14.

Unlike in the first embodiment, a photoresist film (not shown) is then formed by photolithography, and a source/drain impurity is ion-implanted in a specific transistor region in the peripheral circuit region. Annealing for activating the impurity is performed at, e.g., about 950° C. for about 210 sec to form source/drain diffusion layers 30.

Figure 15:
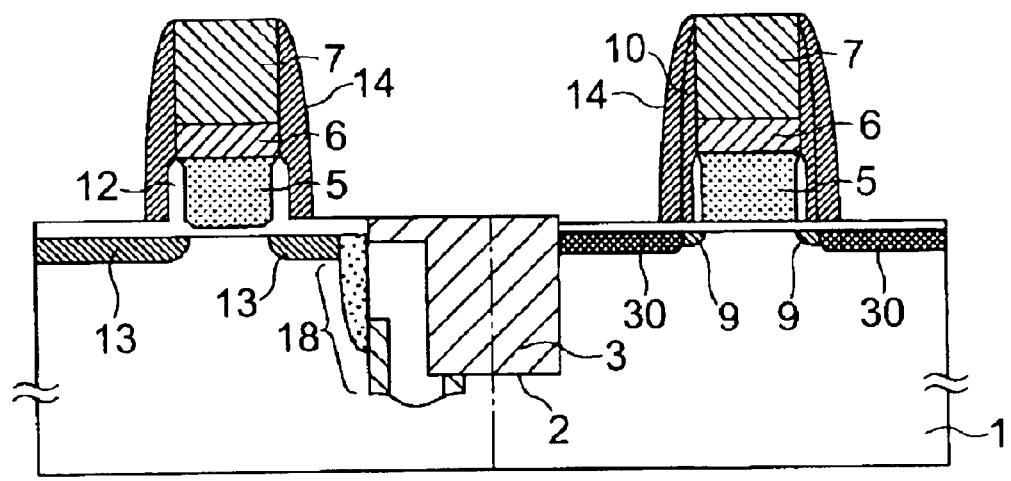
Figure 16:
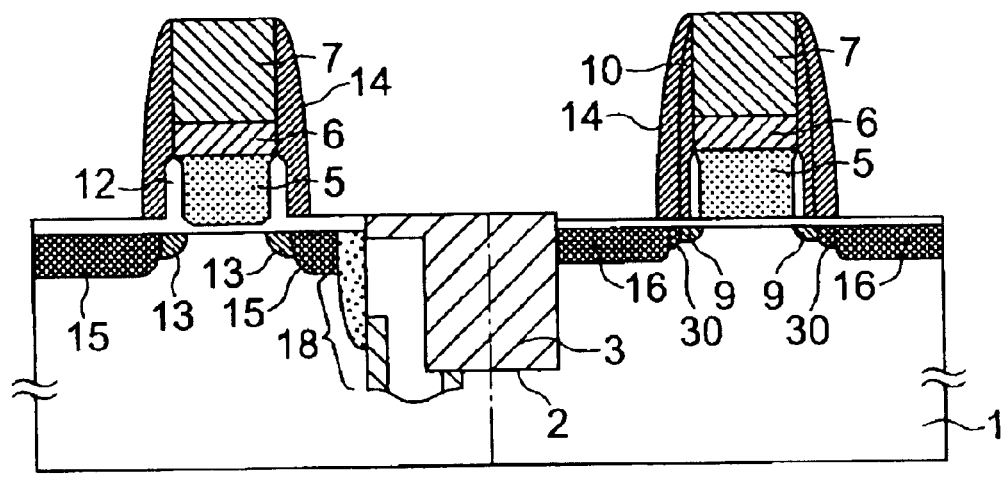
Figure 17:
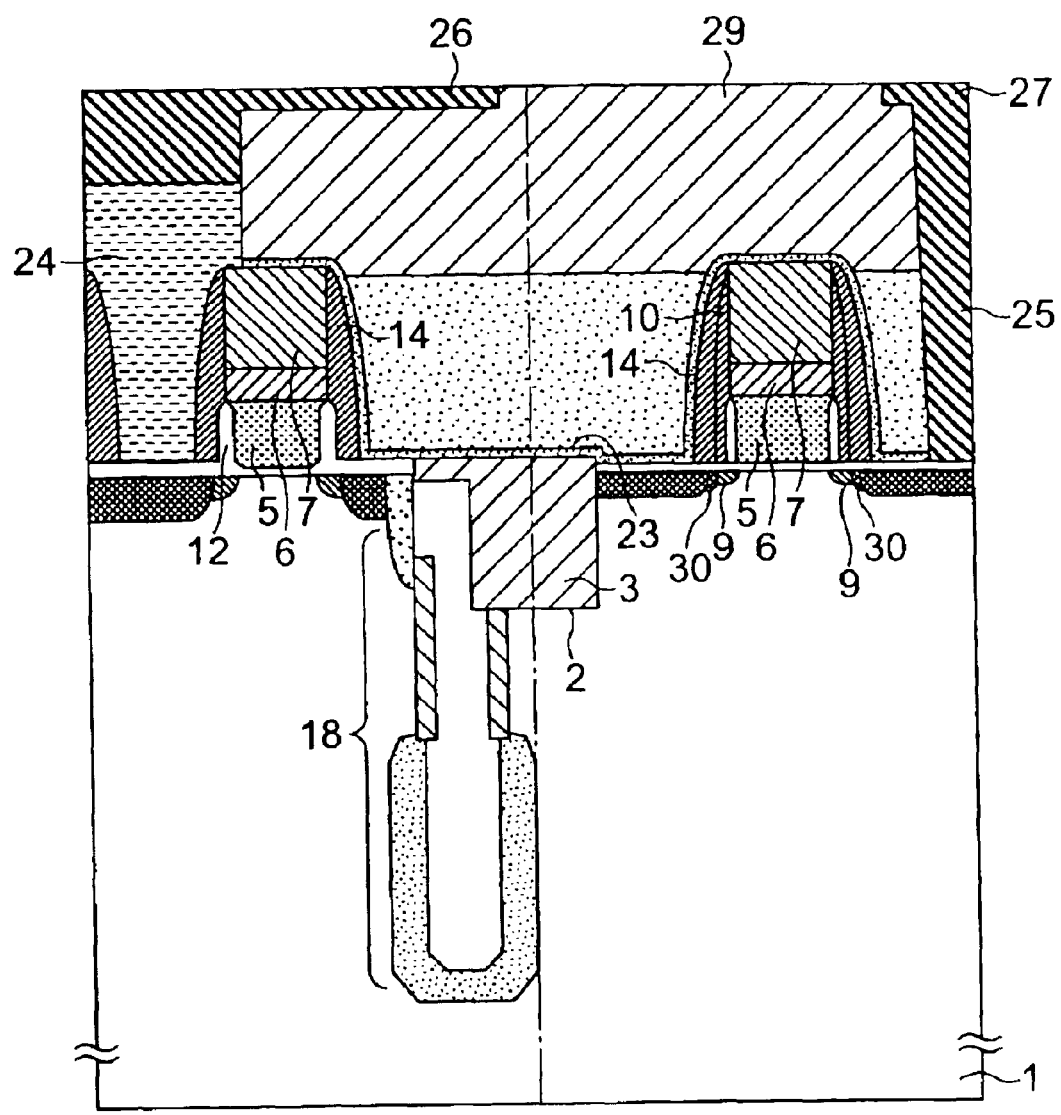

Subsequently, a silicon nitride film about, e.g., 200 Å thick is deposited by LP-CVD, and the entire surface is etched back by RIE. Consequently, as shown in FIG. 15, a spacer silicon nitride film 14 is formed on the side surfaces of the gate electrodes 5 in the transistor regions in both the memory cell array region and peripheral circuit region. The thickness of the spacer silicon nitride film of the transistor in the peripheral circuit region is about 300 Å, i.e., larger than that (about 200 Å) of the silicon nitride film 14 in the memory cell array region, since a film thickness of about 100 Å of the silicon nitride film 10 is added. This structure facilitates the formation of a source/drain structure for suppressing the short channel effect.

In both the peripheral circuit region and memory cell array region, a photoresist film (not shown) is formed by photolithography, an impurity for forming a source/drain is ion-implanted, and activation annealing for activating the impurity is performed at, e.g., about 950° C. for about 210 sec. Consequently, it is possible to form source/drain diffusion layers 15 in the transistor region of the memory cell array region, and source/drain diffusion layers 16 in the transistor region of the peripheral circuit region.

After that, as in the first embodiment, a barrier silicon nitride film 23 which functions as a stopper when contacts hole etching is performed is deposited on the entire surface to have a film thickness of, e.g., about 80 Å by LP-CVD. In addition, a dielectric interlayer 28 made of BPSG is deposited and planarized by CMP. Contact holes are then formed by photolithography and RIE. In the peripheral circuit region, a contact 25 is formed by burying a metal material such as titanium/titanium nitride-tungsten. In the memory cell array region, a memory cell bit line contact 24 is formed.

After that, aluminum or the like is deposited on the entire surface, and photolithography and RIE are used to form a wiring layer 26 such as a bit line in the memory cell array region, and a peripheral circuit wiring layer 27 in the peripheral circuit region, thereby finally completing a DRAM.

As in the above first embodiment, the gate electrode sidewall film thickness in the memory cell array region and that in the peripheral circuit region are different. This improves the data holding characteristic in the memory cell array region, and increases the operating speed in the peripheral circuit region by forming the source/drain structure as a shallow junction. Also, a self-alignment contact formation process can be applied when the gate electrodes are formed. This achieves high applicability to a device having a high integration degree, such as a general-purpose DRAM memory cell.

(3) Third Embodiment

In the first and second embodiments described above, the gate electrode has a stacked structure including a conductive layer and insulating layer. In this embodiment, the gate electrode has only a conductive layer.

Figure 18:
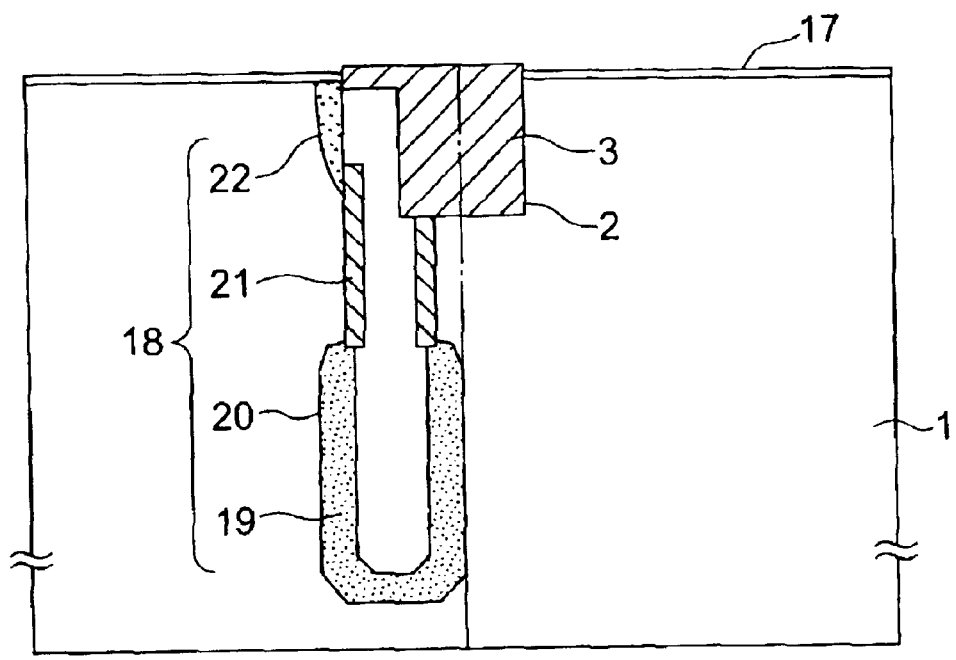
FIGS. 18–32 are the longitudinal sectional views showing the sections of a semiconductor memory in the respective manufacturing steps according to the third embodiment of the present invention.

As shown in FIG. 18, to form an element region in a surface portion of a semiconductor substrate 1 through steps similar to those of the first embodiment, an element isolation groove 2 about 3,000 Å deep is formed by photolithography and RIE. After a thermal oxide film is formed by thermal oxidation on the side surfaces of the element isolation groove 2, a silicon oxide film such as TEOS is buried as an element isolation buried oxide film 3 in the element isolation groove 2. An element region and element isolation region are then formed through a planarizing process such as CMP. In addition, a trench capacitor 18 is formed in a memory cell array region.

On the surface of the semiconductor substrate 1, a sacrificial oxide film 17 (about 70 Å thick) is formed by thermal oxidation. After that, a well/channel impurity is implanted in the memory cell array region and in a peripheral circuit region by photolithography and ion implantation. Finally, activation annealing is performed.

Figure 19:
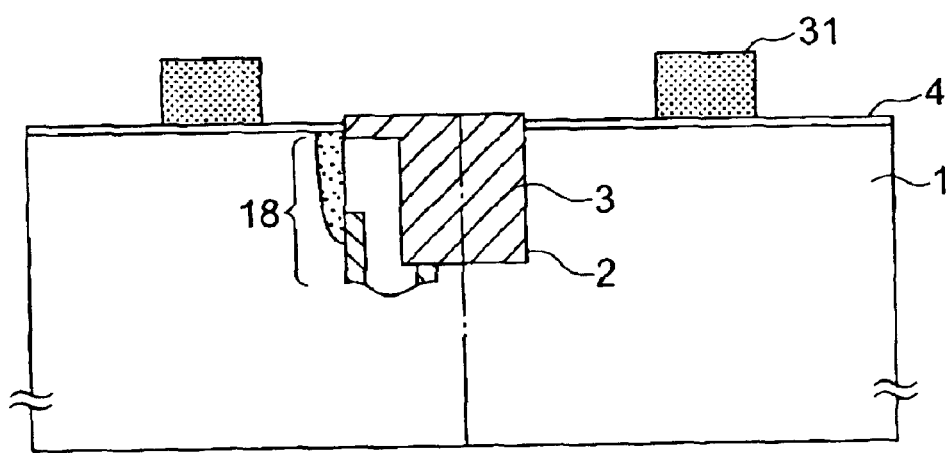

After the sacrificial oxide film 17 on the semiconductor substrate 1 is peeled, as shown in FIG. 19, a gate oxide film 4 about 70 Å thick is formed by thermal oxidation. As a gate electrode material, a phosphorus-doped amorphous silicon film 5, for example, is deposited by LP-CVD. A photoresist film (not shown) having a gate electrode pattern is formed by photolithography. RIE is then performed to etch the gate electrode material to form gate electrodes 31.

Figure 20:
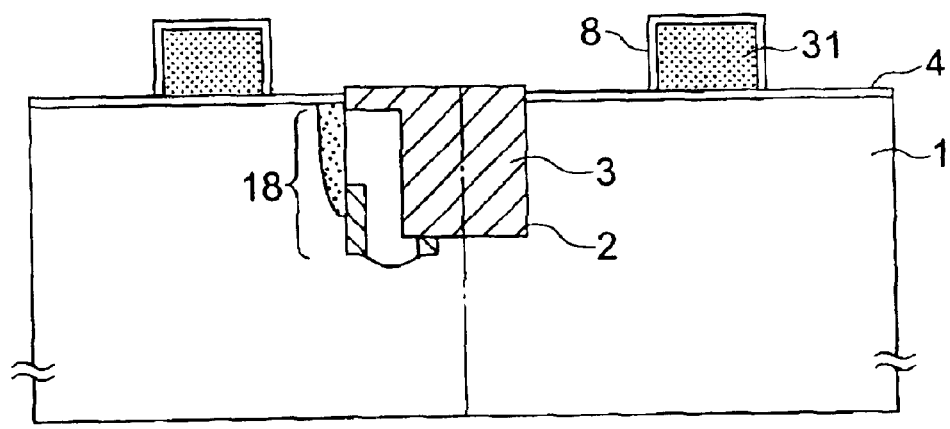
Figure 21:
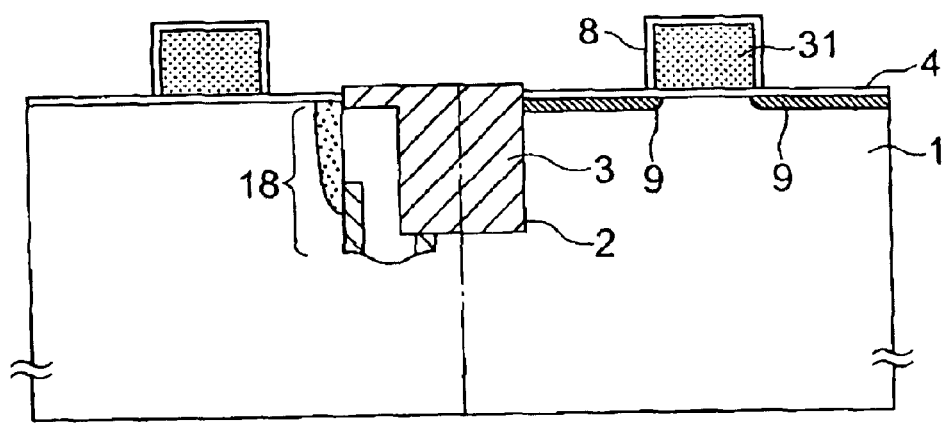

As shown in FIG. 20, RTO is performed to form an oxide film 8 on the side surfaces of the gate electrodes 31. Since the surface of the semiconductor substrate 1 and the surfaces of the gate electrode 31 are also oxidized, the silicon oxide film 8 is formed on the entire surface. The film thickness of the sidewall oxide film of the gate electrodes 31 is preferably about 20 Å, so as not to increase the oxide film thickness on the surface of the semiconductor substrate 1 such that low acceleration conditions can be applied when a source/drain impurity for a transistor in the peripheral circuit region is ion-implanted.

To form an LDD-structure extended region in source/drain diffusion layers of the transistor in the peripheral circuit region, a desired impurity is ion-implanted by using a photoresist film (not shown), thereby forming source/drain diffusion layers 9. After that, the resist film is peeled.

After this diffusion layer formation impurity is ion-implanted, activation annealing for activating the implanted impurity is performed in, e.g., a nitrogen ambient at about 950° C. for about 10 sec. Note that this annealing step need not always be performed.

Figure 22:
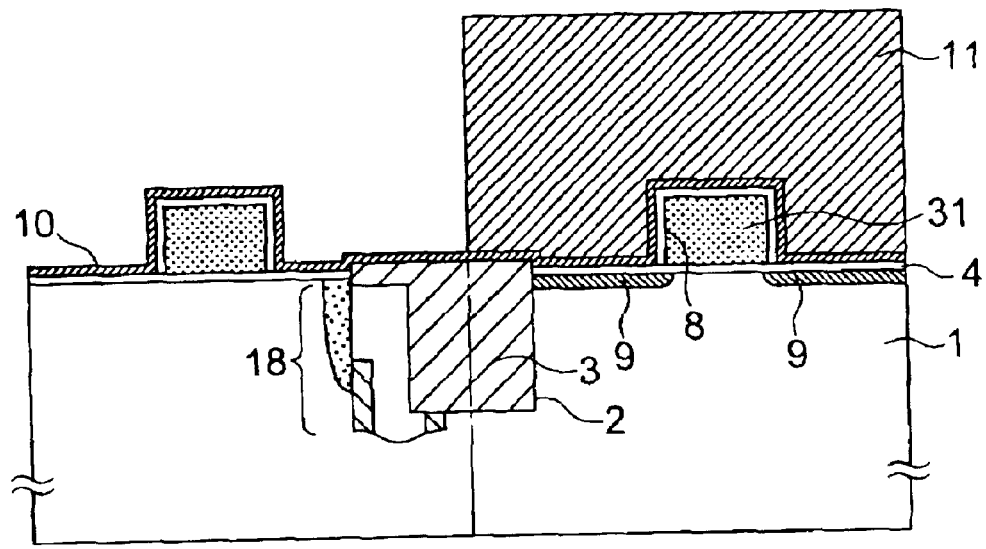

As shown in FIG. 22, a silicon nitride film 10 for protecting the peripheral circuit region is deposited to have a thickness of, e.g., 100 Å by LP-CVD. The film formation temperature can be, e.g., about 750° C. However, if film formation at a low temperature is possible, a lower temperature is more preferable.

Then, a photoresist film 11 is so formed as to protect the peripheral circuit region. After that, the silicon nitride film 10 deposited in the memory cell array region is peeled by isotropic etching (e.g., wet etching or CDE), and the photoresist film 11 is peeled after that.

Figure 23:
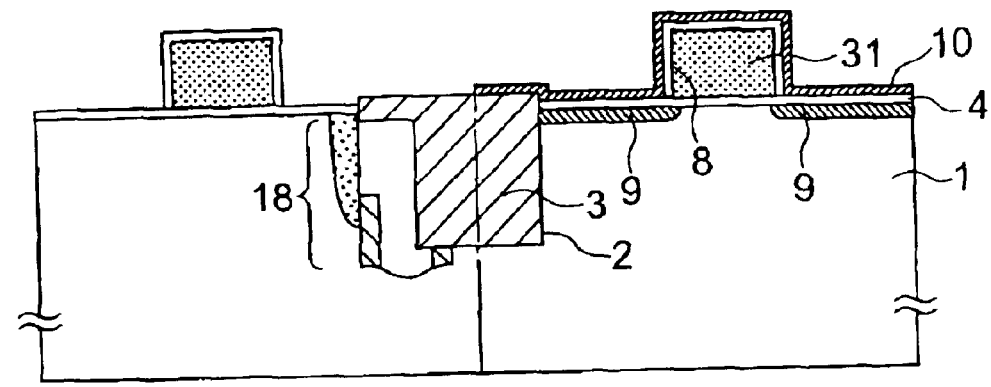
Figure 24:
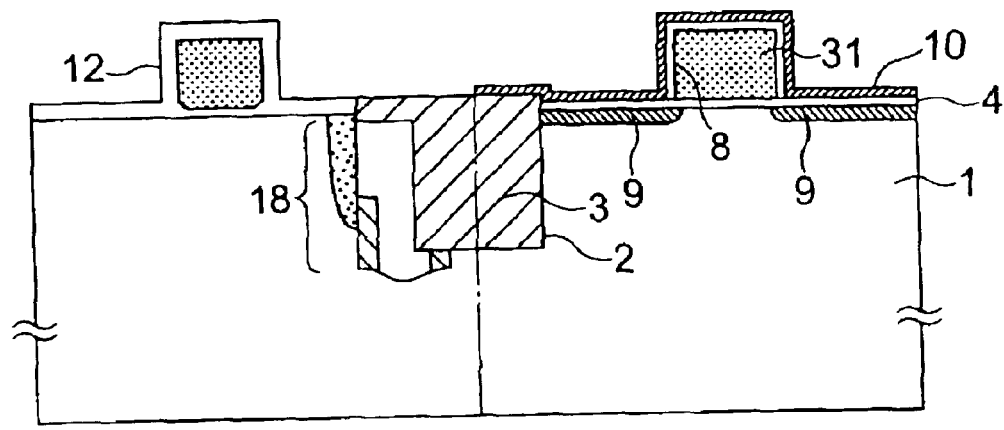

As shown in FIG. 23, while the silicon nitride film 10 is deposited only in the peripheral circuit region, a thermal oxidation step is performed. By this step, as shown in FIG. 24, a thermal oxide film 12 is formed on the side surfaces of the gate electrode 31 and on the surface of the semiconductor substrate 1 in the memory cell array region. The final thickness of the thermal oxide film 12 must be controlled to, e.g., about 100 to 120 Å. Note that this film thickness can be freely changed by combining the device characteristics and is not limited to the range of 100 to 120 Å. Since the peripheral circuit region is covered with the silicon nitride film 10, the surface of the semiconductor substrate 1 and the side surfaces of the gate electrode 31 in the peripheral circuit region do not oxidize, so the thermal oxide film 12 does not form.

Figure 25:
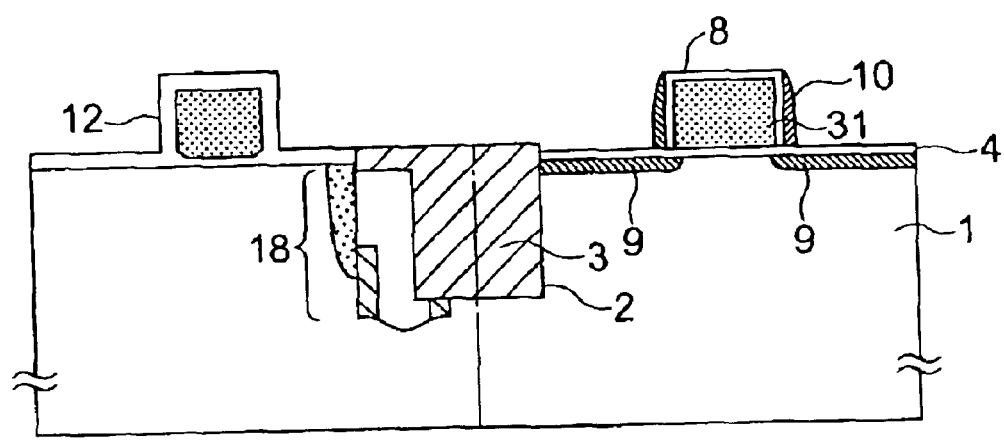

After that, the silicon nitride film 10 is etched back by RIE under the conditions by which the selectivity is high for the thermal oxide film 12. Consequently, as shown in FIG. 25, the silicon nitride film 10 on the semiconductor substrate 1 in the peripheral circuit region and on the buried oxide film 3 in the element isolation groove 2 is etched away, and the silicon nitride film 10 remains only on the side surfaces of the gate electrode 31 in the peripheral circuit region.

Figure 26:
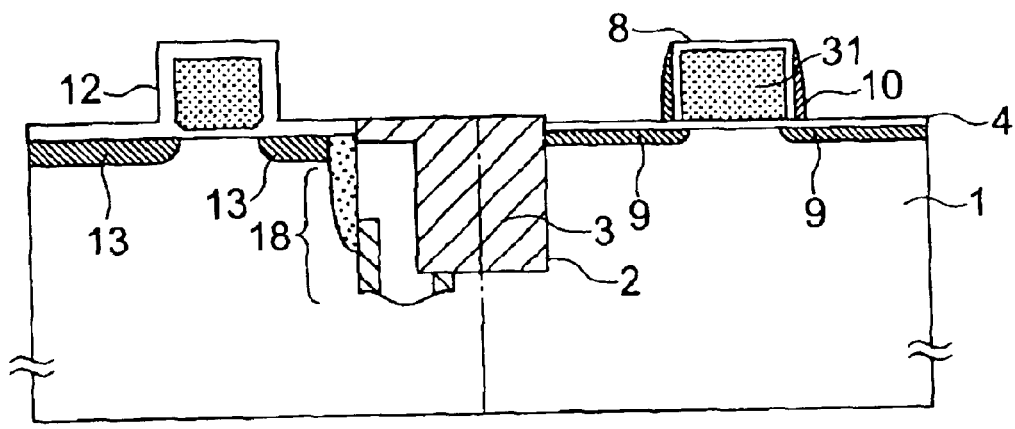

In this state, as shown in FIG. 26, a photoresist film (not shown) is formed by photolithography. A source/drain impurity is then ion-implanted only in the memory cell array region to form source/drain diffusion layers 13. After that, annealing for activating the impurity is performed in, e.g., a nitrogen ambient at about 950° C. for about 10 sec.

Figure 27:
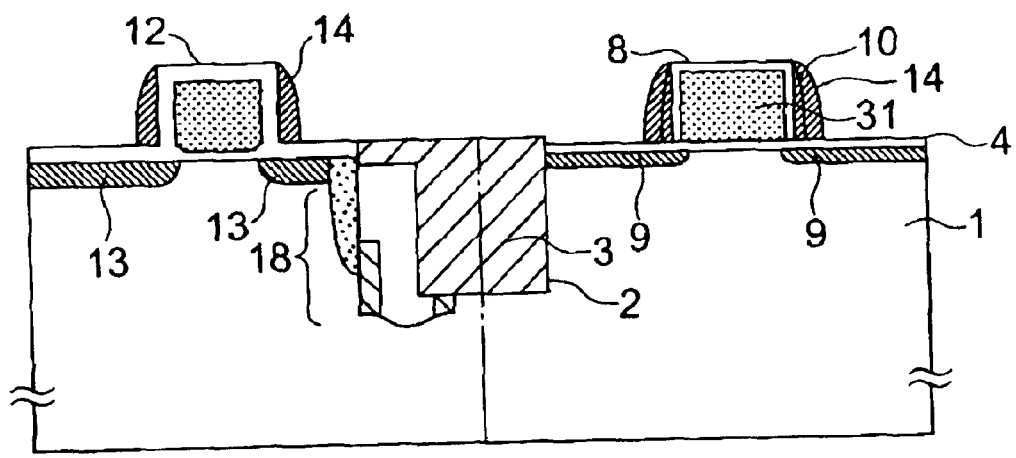

As shown in FIG. 27, a silicon nitride film about 200 Å thick is deposited by LP-CVD, and the entire surface is etched back by RIE, thereby forming a spacer silicon nitride film 14 on the side surfaces of the gate electrodes 31 in both the memory cell array region and peripheral circuit region. As in the first and second embodiments, the thickness of the spacer silicon nitride films 10 and 14 in the peripheral circuit region is about 300 Å, i.e., larger than that (about 200 Å) of the silicon nitride film 14 in the memory cell region. Accordingly, it is possible to obtain a structure which facilitates the formation of a source/drain structure for suppressing the short channel effect.

Figure 28:
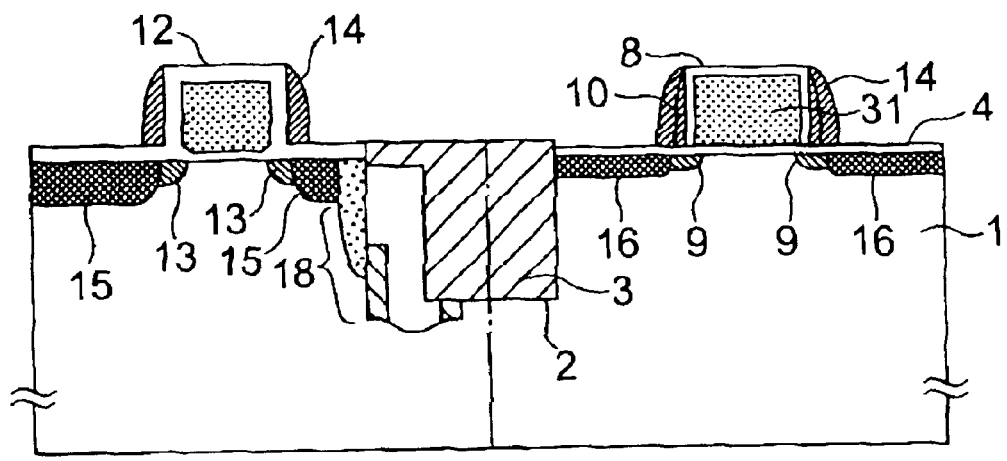

A photoresist film (not shown) is formed by photolithography in both the peripheral circuit region and memory cell array region. As shown in FIG. 28, an impurity is ion-implanted, and activation annealing for activating the impurity is performed in a nitrogen ambient at about 950° C. for about 10 sec. As a consequence, it is possible to form source/drain diffusion layers 15 in the memory cell array region, and source/drain diffusion layers 16 in the peripheral circuit region.

Figure 29:
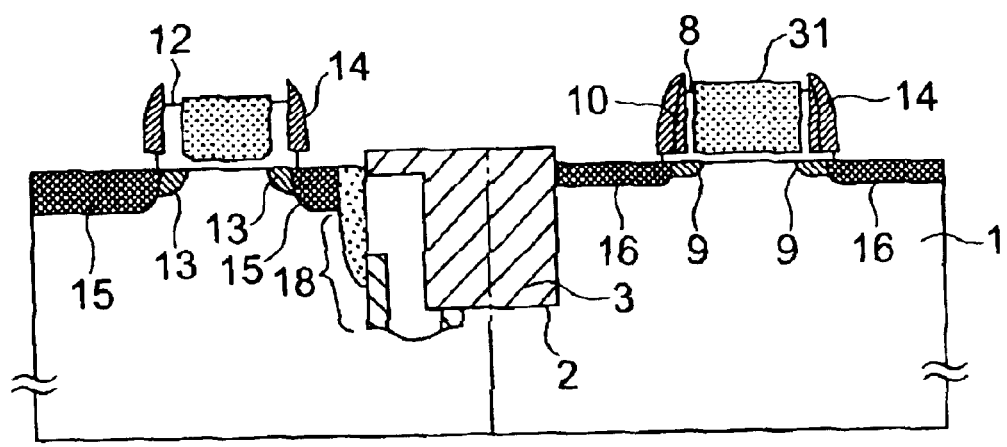

As shown in FIG. 29, a liquid chemical such as hydrofluoric acid is used to etch away the thermal oxide films 4 and 12 on the surface of the semiconductor substrate 1 and on the gate electrodes 31. In this manner, the silicon on the surface of the semiconductor substrate 1 and the polysilicon on the upper surfaces of the gate electrodes 31 are exposed.

Figure 30:
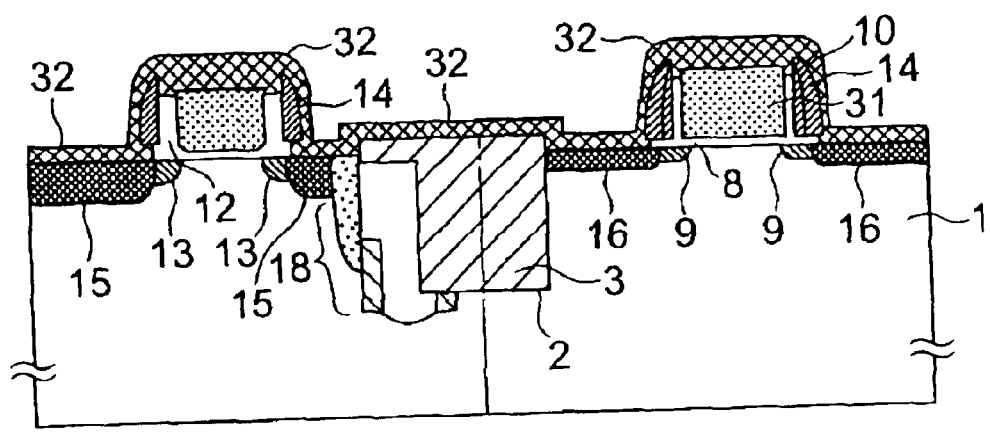
Figure 31:
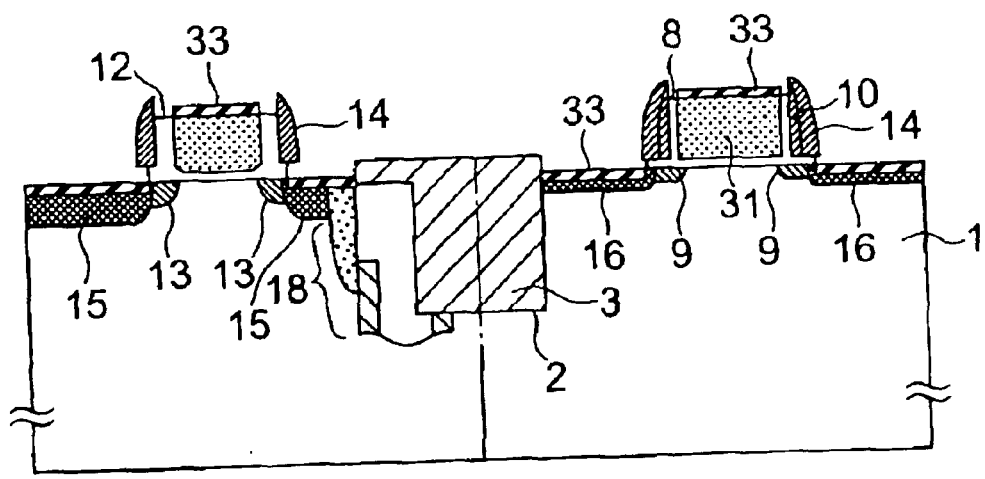

As shown in FIG. 30, a stacked film 32 made up of, e.g., cobalt/titanium/titanium nitride (Co/Ti/TiN) (120/200/200 Å thick) is deposited by sputtering or the like. Annealing is then performed in a nitrogen ambient at about 480° C. for about 60 sec, and the stacked film 32 is removed by decomposition with sulfuric acid. As shown in FIG. 31, annealing is performed again in a nitrogen ambient at about 800° C. for about 30 sec to selectively form a salicide film 33 on the surface of the semiconductor substrate 1 and on the upper surfaces of the gate electrodes 31.

To prevent deterioration of the data holding characteristic, it is also possible to add a process by which, e.g., no salicide film 33 forms on a storage node contact 22. That is, a salicide process meeting the device characteristics can be applied.

Figure 32:
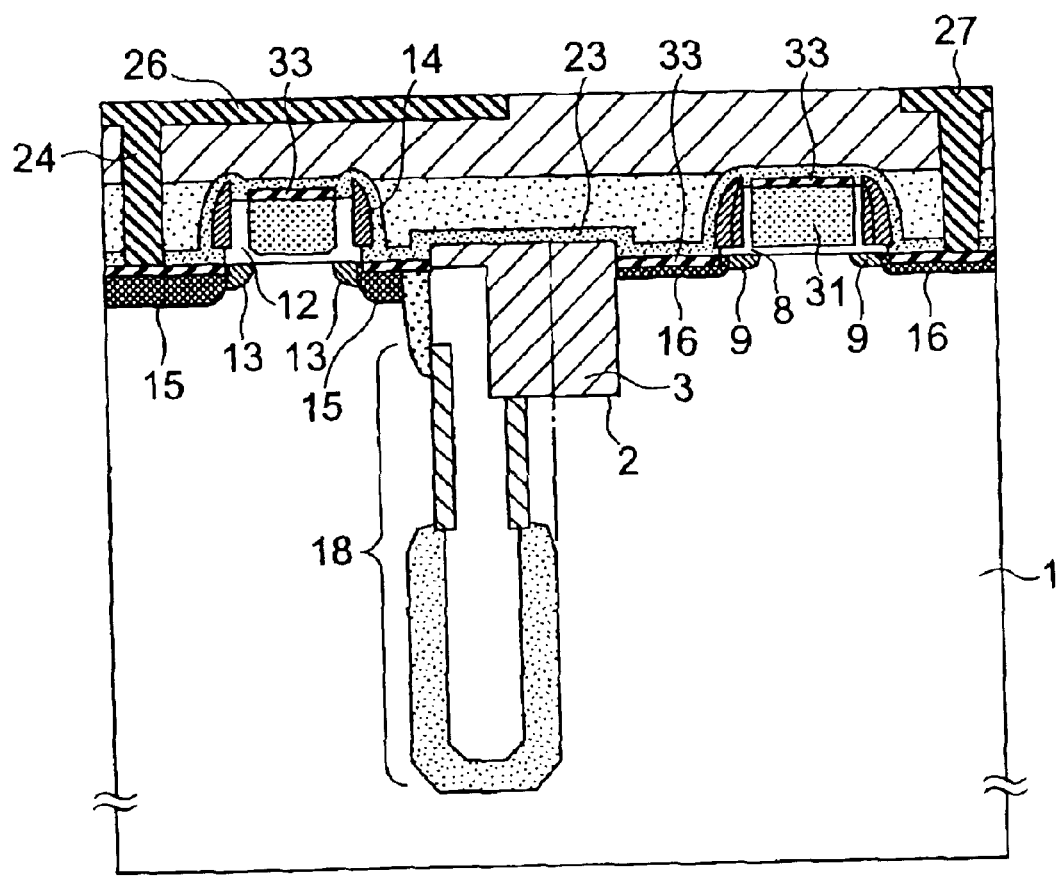

After that, as shown in FIG. 32 as in the first and second embodiments, a barrier silicon nitride film 23 which functions as a stopper when contact hole etching is performed is deposited on the entire surface to have a film thickness of, e.g., about 80 Å by LP-CVD. In addition, a dielectric interlayer 28 made of BPSG is deposited and planarized by CMP. Contact holes are then formed by photolithography and RIE. In the peripheral circuit region, a contact 25 is formed by burying a metal material such as titanium/titanium nitride-tungsten. In the memory cell array region, a memory cell bit line contact 24 is formed.

After that, aluminum or the like is deposited on the entire surface, and photolithography and RIE are used to form a wiring layer 26 such as a bit line in the memory cell array region, and a peripheral circuit wiring layer 27 in the peripheral circuit region, thereby finally completing a DRAM.

In this embodiment, as in the first and second embodiments, the gate electrode sidewall film thickness is small in the memory cell array region and large in the peripheral circuit region. This improves the data holding characteristic in the memory cell array region, and at the same time increases the operating speed in the peripheral circuit region by forming the source/drain structure as a shallow junction.

Unlike in the first and second embodiments described previously, only the conductive layer such as a polysilicon film is deposited and patterned into the shape of an electrode. Since this improves the compatibility with a silicide process, this embodiment is particularly useful for a device which contains both a logic circuit requiring a high operating speed and a DRAM.

(4) Fourth Embodiment

In this embodiment, a trench capacitor in the first embodiment described previously is replaced with a stacked capacitor. The other constituent elements and their manufacturing steps are the same as in the first embodiment.

Figure 33:
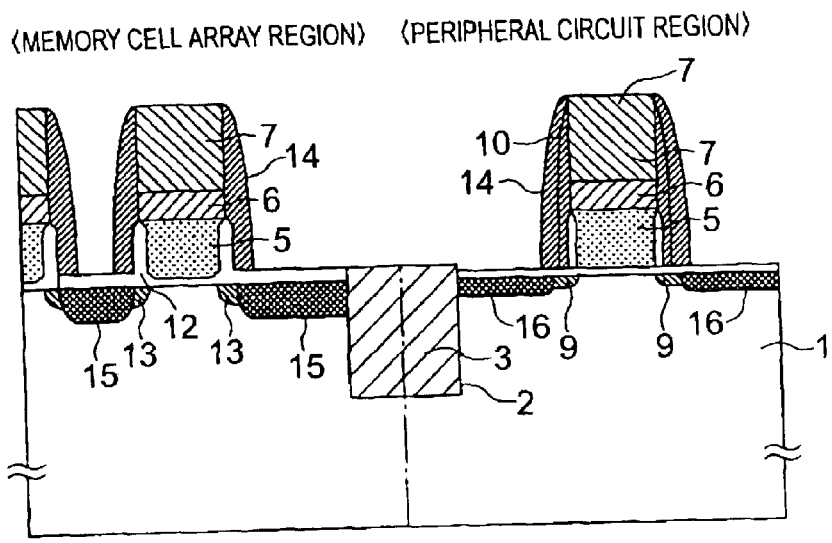
FIGS. 33–34 are the longitudinal sectional views showing the sections of a semiconductor memory in the respective manufacturing steps according to the fourth embodiment of the present invention.
Figure 34:
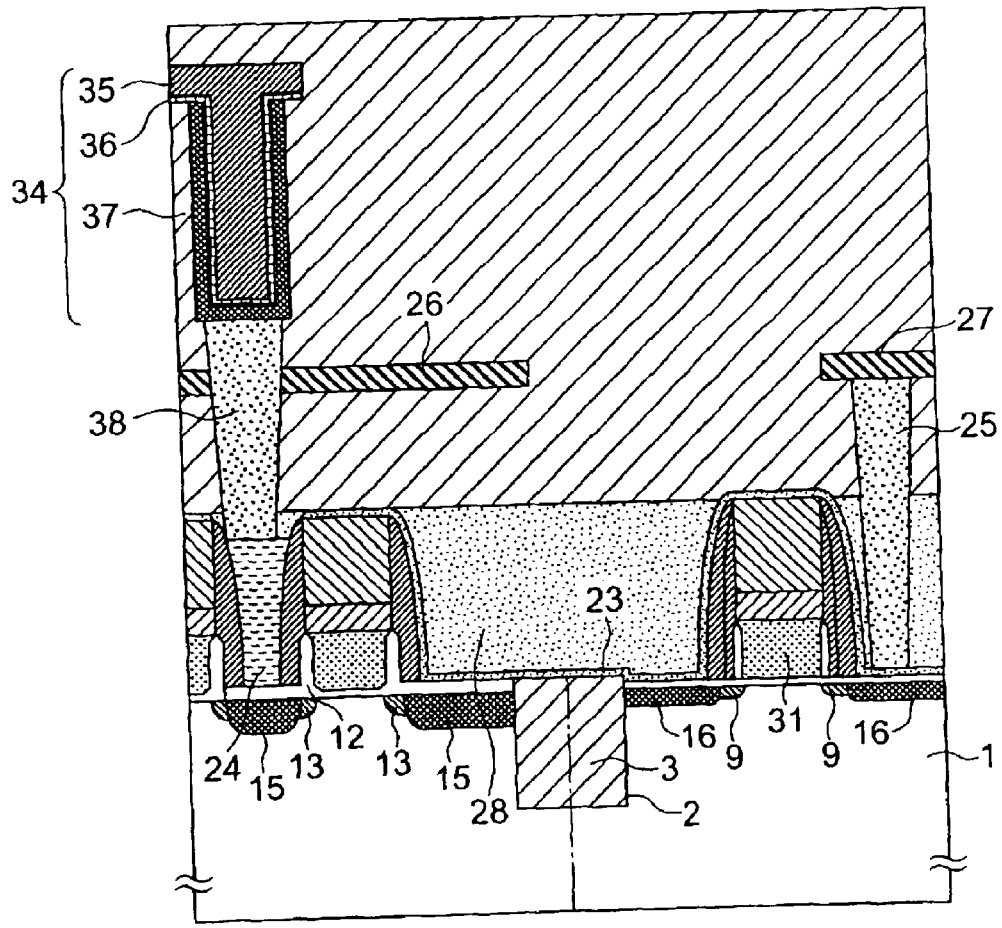

As shown in FIG. 33, in a surface portion of a semiconductor substrate 1, an element isolation groove 2 about 3,000 Å deep is formed by photolithography and RIE. After a thermal oxide film is formed by thermally oxidizing silicon side walls in the element isolation groove 2, a silicon oxide film such as TEOS is buried as an element isolation buried oxide film 3. An element region and element isolation region are formed through a planarizing process such as CMP.

After that, transistors are formed in a memory cell array region and peripheral circuit region through the same steps as in the first embodiment shown in FIGS. 2 to 11.

In addition, as in the first embodiment, a barrier silicon nitride film 23 which functions as a stopper when contact hole etching is performed is deposited on the entire surface to have a film thickness of, e.g., about 80 Å by LP-CVD. Furthermore, a dielectric interlayer 28 made of BPSG is deposited and planarized by CMP. Contact holes are then formed by photolithography and RIE. In the peripheral circuit region, a contact 25 is formed by burying a metal material such as titanium/titanium nitride-tungsten. In the memory cell array region, a memory cell bit line contact 24 is formed.

After that, aluminum or the like is deposited on the entire surface, and photolithography and RIE are used to form a wiring layer 26 such as a bit line in the memory cell array region, and a peripheral circuit wiring layer 27 in the peripheral circuit region.

A DRAM is completed by forming a stacked capacitor 34 including a plate electrode 35, capacitor dielectric film 36, and storage node electrode 37.

In this embodiment, as in the first, second, and third embodiments described above, the gate electrode sidewall film thickness is small in the memory cell array region and large in the peripheral circuit region. This improves the data holding characteristic in the memory cell array region, and at the same time increases the operating speed in the peripheral circuit region by forming the source/drain structure as a shallow junction.

Also, as in the first and second embodiments, a self-alignment contact formation process can be applied when the gate electrodes are formed. This achieves high applicability to a device having a high integration degree, such as a general-purpose DRAM memory cell.

(5) Fifth Embodiment

In this embodiment, a trench capacitor in the second embodiment described previously is replaced with a stacked capacitor. The other constituent elements and their manufacturing steps are the same as in the second embodiment.

Figure 35:
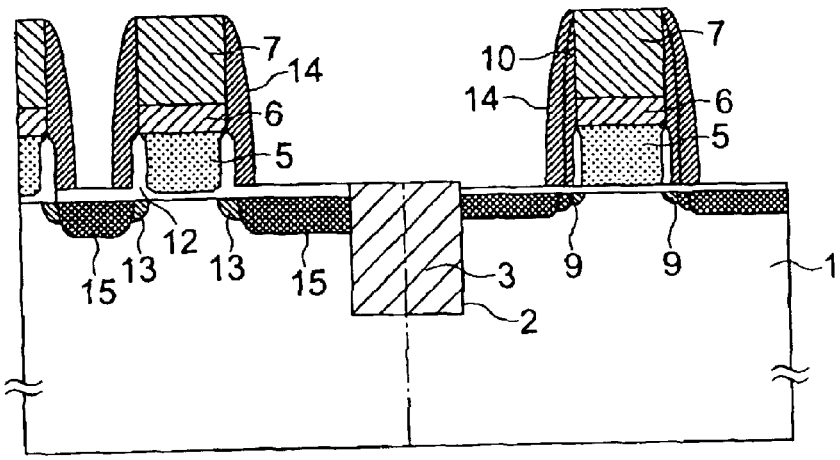
FIGS. 35–36 are the longitudinal sectional views showing the sections of a semiconductor memory in the respective manufacturing steps according to the fifth embodiment of the present invention.
Figure 36:
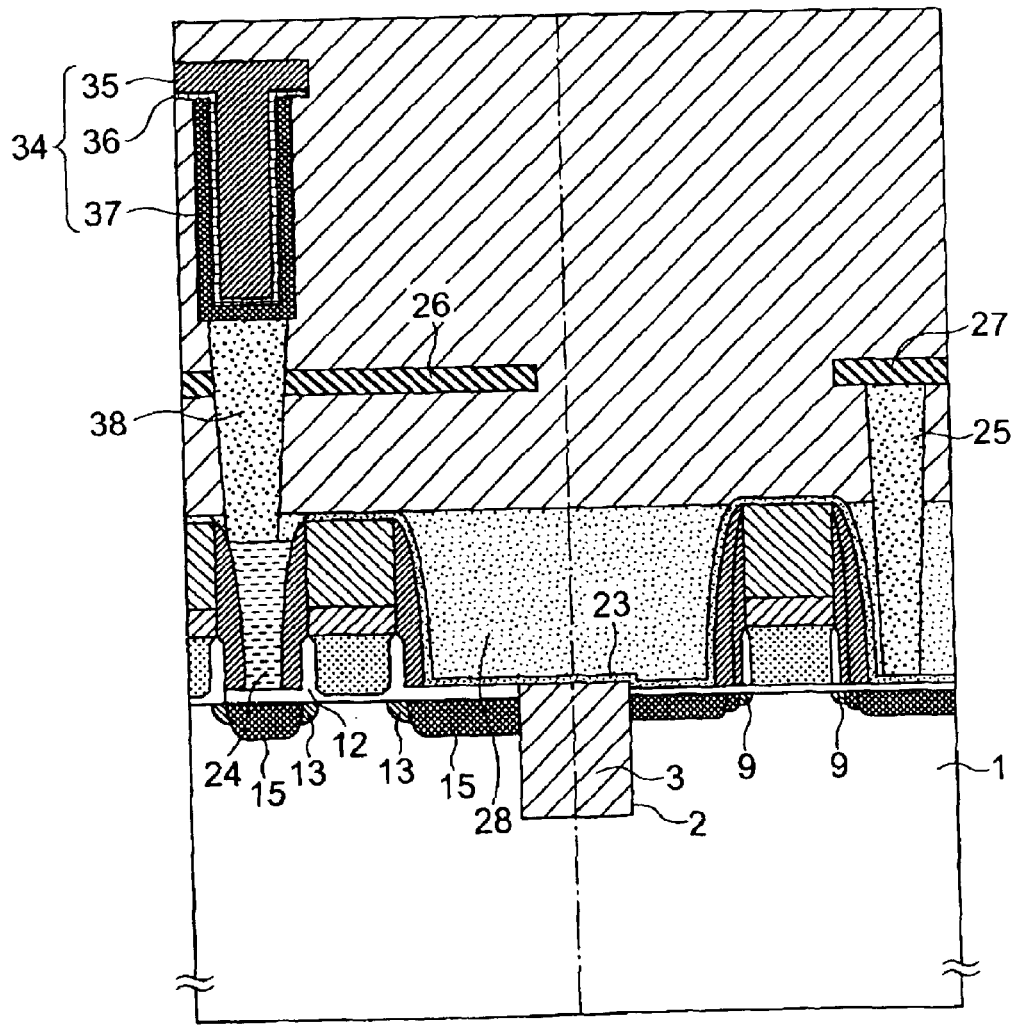

As shown in FIG. 35, in a surface portion of a semiconductor substrate 1, an element isolation groove 2 about 3,000 Å deep is formed by photolithography and RIE. After a thermal oxide film is formed by thermally oxidizing silicon side walls in the element isolation groove 2, a silicon oxide film such as TEOS is buried as an element isolation buried oxide film 3. An element region and element isolation region are formed through a planarizing process such as CMP.

After that, transistors are formed in a memory cell array region and peripheral circuit region through the same steps as in the second embodiment shown in FIGS. 13 to 17.

In addition, as in the second embodiment, a barrier silicon nitride film 23 which functions as a stopper when contact hole etching is performed is deposited on the entire surface to have a film thickness of, e.g., about 80 Å by LP-CVD. Furthermore, a dielectric interlayer 28 made of BPSG is deposited and planarized by CMP. Contact holes are then formed by photolithography and RIE. In the peripheral circuit region, a contact 25 is formed by burying a metal material such as titanium/titanium nitride-tungsten. In the memory cell array region, a memory cell bit line contact 24 is formed.

After that, aluminum or the like is deposited on the entire surface, and photolithography and RIE are used to form a wiring layer 26 such as a bit line in the memory cell array region, and a peripheral circuit wiring layer 27 in the peripheral circuit region.

A DRAM is completed by forming a stacked capacitor 34 including a plate electrode 35, capacitor dielectric film 36, and storage node electrode 37.

In this embodiment, as in the first, second, and third embodiments described above, the gate electrode sidewall film thickness is small in the memory cell array region and large in the peripheral circuit region. This improves the data holding characteristic in the memory cell array region, and at the same time increases the operating speed in the peripheral circuit region by forming the source/drain structure as a shallow junction.

Also, as in the second embodiment, a self-alignment contact formation process can be applied when the gate electrodes are formed. This achieves high applicability to a device having a high integration degree, such as a general-purpose DRAM memory cell.

(6) Sixth Embodiment

In this embodiment, a trench capacitor in the third embodiment described previously is replaced with a stacked capacitor. The other constituent elements and their manufacturing steps are the same as in the third embodiment.

Figure 37:
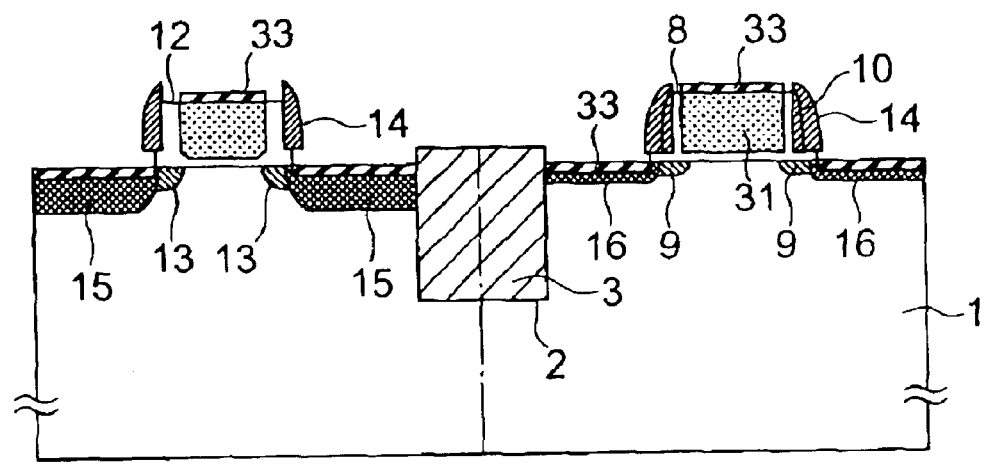
FIGS. 37–39 are the longitudinal sectional views showing the sections of a semiconductor memory in the respective manufacturing steps according to the sixth embodiment of the present invention.
Figure 38:
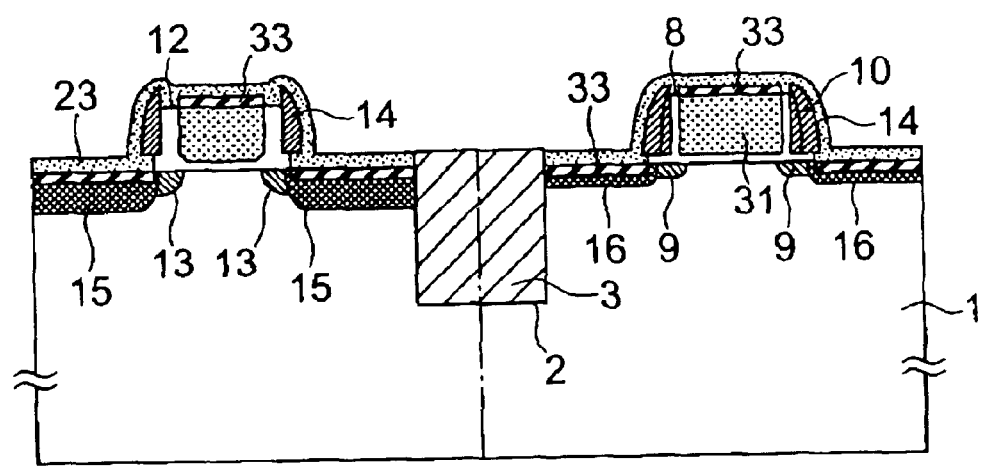
Figure 39:
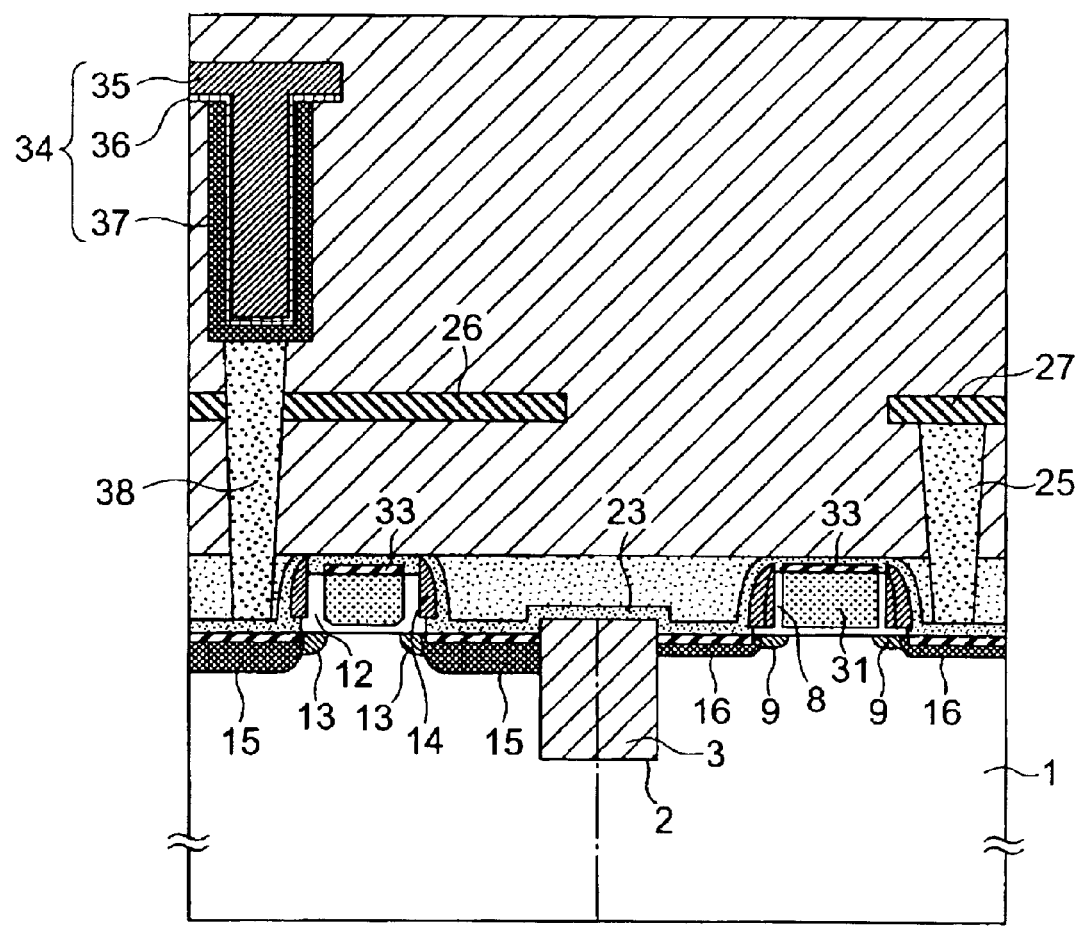

As shown in FIG. 37, in a surface portion of a semiconductor substrate 1, an element isolation groove 2 about 3,000 Å deep is formed by photolithography and RIE. After a thermal oxide film is formed by thermally oxidizing silicon side walls in the element isolation groove 2, a silicon oxide film such as TEOS is buried as an element isolation buried oxide film 3. An element region and element isolation region are formed through a planarizing process such as CMP.

After that, transistors are formed in a memory cell array region and peripheral circuit region through the same steps as in the third embodiment shown in FIGS. 18 to 32.

In addition, as in the third embodiment, a barrier silicon nitride film 23 which functions as a stopper when contact hole etching is performed is deposited on the entire surface to have a film thickness of, e.g., about 80 Å by LP-CVD. Furthermore, a dielectric interlayer 28 made of BPSG is deposited and planarized by CMP. Contact holes are then formed by photolithography and RIE. In the peripheral circuit region, a contact 25 is formed by burying a metal material such as titanium/titanium nitride-tungsten. In the memory cell array region, a memory cell bit line contact 24 is formed.

After that, aluminum or the like is deposited on the entire surface, and photolithography and RIE are used to form a wiring layer 26 such as a bit line in the memory cell array region, and a peripheral circuit wiring layer 27 in the peripheral circuit region.

A DRAM is completed by forming a stacked capacitor 34 including a plate electrode 35, capacitor dielectric film 36, and storage node electrode 37.

In this embodiment, as in the third embodiment described above, the gate electrode sidewall film thickness is small in the memory cell array region and large in the peripheral circuit region. This improves the data holding characteristic in the memory cell array region, and at the same time increases the operating speed in the peripheral circuit region by forming the source/drain structure as a shallow junction.

Each of the above embodiments is merely an example and hence does not limit the present invention, so each embodiment can be variously modified within the technical scope of the present invention. For example, the material, formation method, formation conditions, and thickness of each film are examples and can be freely selected as desired.

In the semiconductor memory and the method of manufacturing the same as described above, the gate electrode sidewall film thickness is decreased in the memory cell array region and increased in the peripheral circuit region. This increases the size of bird's beaks formed below the side surfaces of the gate electrode in the memory cell array region. Since this alleviates the electric field between this portion and the source/drain diffusion layers, the GIDL current reduces, so the data holding characteristic improves. In addition, the source/drain impurity can be ion-implanted at low acceleration in the peripheral circuit region. Therefore, the source/drain structure is realized as a shallow junction. This suppresses the short channel effect and increases the operating speed of the transistor.

What is claimed is:

1. A semiconductor memory having a memory cell array region and peripheral circuit region, comprising:
    a gate electrode formed on a semiconductor substrate via an insulating film in each of said memory cell array region and peripheral circuit region, and including a conductive layer;
    a first oxide film formed on side surfaces of said conductive layer of said gate electrode and on said semiconductor substrate in said memory cell array region;
    a second oxide film formed on side surfaces of said conductive layer of said gate electrode and on said semiconductor substrate in said peripheral circuit region, and having a film thickness smaller than that of said first oxide film;
    a first nitride film formed on side surfaces of said gate electrode in said memory cell array region; and
    a second nitride film formed on side surfaces of said gate electrode in said peripheral circuit region, and having a film thickness larger than that of said first nitride film.

2. A memory according to claim 1, wherein a bird's beak formed by said first oxide film below the side surface of said gate electrode in said memory cell array region is larger than a bird's beak formed by said second oxide film below the side surface of said gate electrode in said peripheral circuit region.

3. A memory according to claim 1, further comprising:
    in said peripheral circuit region, first source and drain diffusion layers formed by implanting an impurity into a surface portion of said semiconductor substrate by using, as masks, said gate electrode and said second oxide film on the side surfaces of said conductive layer included in said gate electrode; and
    in said memory cell array region, second source and drain diffusion layers formed by implanting an impurity into a surface portion of said semiconductor substrate by using, as masks, said gate electrode and said first oxide film on the side surfaces of said conductive layer included in said gate electrode.

4. A memory according to claim 1, further comprising:
    in said peripheral circuit region, third source and drain diffusion layers formed by implanting an impurity into a surface portion of said semiconductor substrate by using, as masks, said gate electrode, said second oxide film on the side surfaces of said conductive layer included in said gate electrode, and said second nitride film formed on the side surfaces of said gate electrode; and
    in said memory cell array region, fourth source and drain diffusion layers formed by implanting an impurity into a surface portion of said semiconductor substrate by using, as masks, said gate electrode, said first oxide film on the side surfaces of said conductive layer included in said gate electrode, and said first nitride film formed on the side surfaces of said gate electrode.

5. A memory according to claim 1, further comprising a trench capacitor formed in a surface portion of said semiconductor substrate in said memory cell array region.

6. A memory according to claim 1, further comprising a stacked capacitor formed above said semiconductor substrate in said memory cell array region.

7. A semiconductor memory having a memory cell array region and peripheral circuit region, comprising:
    a gate electrode formed on a semiconductor substrate via an insulating film in each of said memory cell array region and peripheral circuit region;
    a first oxide film formed on side surfaces of said gate electrode in said memory cell array region;
    a second oxide film formed on side surfaces of said gate electrode in said peripheral circuit region, and having a film thickness smaller than that of said first oxide film;
    a first nitride film formed on said first oxide film on the side surfaces of said gate electrode in said memory cell array region; and
    a second nitride film formed on said second oxide film on the side surfaces of said gate electrode in said peripheral circuit region, and having a film thickness larger than that of said first nitride film.

* * * * *